(12) United States Patent
Makino et al.

(10) Patent No.: US 6,235,626 B1
(45) Date of Patent: May 22, 2001

(54) METHOD OF FORMING A GATE ELECTRODE USING AN INSULATING FILM WITH AN OPENING PATTERN

(75) Inventors: Yoichi Makino; Hironobu Miyamoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/201,151

(22) Filed: Nov. 30, 1998

(30) Foreign Application Priority Data

Nov. 28, 1997 (JP) .................................... 9-328023

(51) Int. Cl.[7] .............................................. H01L 21/4763
(52) U.S. Cl. ......................... 438/637; 257/280; 257/281; 257/284; 257/192; 257/774; 438/167; 438/637; 438/638; 438/639; 438/640
(58) Field of Search .................................... 257/411, 192, 257/280, 281, 284, 774; 438/167, 637–640

(56) References Cited

U.S. PATENT DOCUMENTS

| | | | | |
|---|---|---|---|---|
| 4,377,899 | * | 3/1983 | Otani et al. ............................ | 29/571 |
| 5,362,677 | * | 11/1994 | Sakamoto ............................. | 437/203 |
| 5,391,899 | * | 2/1995 | Kohno .................................. | 257/192 |
| 5,444,022 | * | 8/1995 | Gardner ............................... | 437/195 |
| 5,457,070 | * | 10/1995 | Hirade ................................. | 437/195 |
| 5,880,860 | * | 3/1999 | Kohno .................................. | 438/180 |
| 5,899,746 | * | 5/1999 | Mukai .................................. | 438/700 |
| 6,127,734 | * | 10/2000 | Kimura ................................ | 257/774 |

FOREIGN PATENT DOCUMENTS

| | | |
|---|---|---|
| 64-7572 | 1/1989 | (JP) . |
| 2-238636 | 9/1990 | (JP) . |
| 7-183315 | 7/1995 | (JP) . |
| 8-97235 | 4/1996 | (JP) . |

\* cited by examiner

Primary Examiner—Matthew Smith
Assistant Examiner—Belur Keshavan
(74) Attorney, Agent, or Firm—Young & Thompson

(57) ABSTRACT

The present invention provides a method of forming a gate recess in an insulating film on a substrate for depositing a gate electrode film being in contact with a part of the substrate and also extending at least within the gate recess. The method comprises the steps of: forming an etching mask pattern with a first opening pattern on the insulating film; carrying out a first anisotropic etching process by use of the etching mask pattern at a first selective ratio of the etching mask pattern to the insulating film, thereby to form a first recessed portion having a bottom which lies at a first level higher than an interface level between the insulating film and the substrate; and carrying out a second anisotropic etching process by use of the etching mask pattern again at a second selective ratio of the etching mask pattern to the insulating film, wherein the second selective ratio is higher than the first selective ratio, thereby to form a gate recess which comprises a second recessed portion both having a bottom which lies at the interface level and having first side walls of a first oblique angle and a third recessed portion both having a bottom united with a top of the second recessed portion and having second side walls of a second oblique angle which is smaller than the first oblique angle.

21 Claims, 55 Drawing Sheets the second bottom width of 100 nanometers

● : first oblique angle $\theta 1$ is 75 degrees

▼ : first oblique angle $\theta 1$ is 80 degrees

■ : first oblique angle $\theta 1$ is 85 degrees the second bottom width of 150 nanometers ○ : first oblique angle $\theta 1$ is 75 degrees △ : first oblique angle $\theta 1$ is 80 degrees □ : first oblique angle $\theta 1$ is 85 degrees etching time of the second dry etching process (min.)

● : the opening size "x3"
■ : the aspect ratio of z/x3 etching time of the third dry etching process (min.)

● : the opening size "x3"
■ : the aspect ratio of z/x3

METHOD OF FORMING A GATE ELECTRODE USING AN INSULATING FILM WITH AN OPENING PATTERN

BACKGROUND OF THE INVENTION

The present invention relates to a method of forming a gate electrode of a field effect transistor using an insulating film with an opening pattern for burying a metal material into the opening pattern.

A conventional method of forming a fine and low resistive gate electrode of a field effect transistor is disclosed in Japanese laid-open patent publication No. 5-326564 and will be described with reference to FIGS. 1A through 1G which are fragmentary cross sectional elevation views illustrative of the conventional method of forming a fine and low resistive gate eletrode of a field effect transistor. FIG. 1G is a fragmentary cross sectional elevation view illustrative of a double stage recessed structure field effect transistor formed in the conventional fabrication method. The conventional field effect transistor has a semi-insulating GaAs substrate 21, a GaAs buffer layer 22 provided on the semi-insulating GaAs substrate 21, a first n-GaAs layer 23a provided on the GaAs buffer layer 22, a first n-AlGaAs layer 24a provided on the first n-GaAs layer 23a, a second n-GaAs layer 23b provided on the first n-AlGaAs layer 24a, a second n-AlGaAs layer 24b provided on the second n-GaAs layer 23b, n+-GaAs layers 25 provided on a predetermined region, except for a gate region, of said second n-AlGaAs layer 24b, silicon dioxide side walls 28 provided on selected regions in the gate region, except for a center region thereof, a Ti/Pt/Au gate electrode film 29 provided on the center region in the gate region and also over the silicon dioxide side walls 28, and AuGe/Ni/Au ohmic contacts 30 on the Ti/Pt/Au gate electrode film 29 and the n+-GaAs layers 25. The Ti/Pt/Au gate electrode film 29 has a bottom portion which is provided within a recessed portion formed in the first n-GaAs layer 23a.

With reference to FIG. 1A, the GaAs buffer layer 22 is formed on the semi-insulating GaAs substrate 21. The first n-GaAs layer 23a is formed on the GaAs buffer layer 22. The first n-AlGaAs layer 24a is formed on the first n-GaAs layer 23a. The second n-GaAs layer 23b is formed on the first n-AlGaAs layer 24a. The second n-AlGaAs layer 24b is formed on the second n-GaAs layer 23b. The n+-GaAs layers 25 is formed on a predetermined region, except for a gate region, of the second n-AlGaAs layer 24b. A silicon oxide nitride film SiON 26 having a thickness of 2000 angstroms is then formed on the n+-GaAs layers 25.

With reference to FIG. 1B, a photo-resist film 27 is applied on the silicon oxide nitride film SiON 26 and then an opening pattern having a 0.5 micrometers size is formed in the photo-resist film 27 so that the opening pattern is positioned over a predetermined gate region for forming a gate electrode. The photo-resist pattern 27 is used as an etching mask for reaction ion etching to the silicon oxide nitride film SiON 26, the n+-GaAs layers 25 and the second n-AlGaAs layer 24b to form a recessed portion.

With reference to FIG. 1C, after the used photo-resist pattern 27 is removed, a plasma enhanced chemical vapor deposition method is carried out to deposit a silicon dioxide film having a thickness of 4000 angstroms for subsequent reaction ion etching to the deposited silicon dioxide film, whereby silicon dioxide side walls 28 are formed which have a width of about 0.2 micrometers within the recessed portion, wherein a center region of the second n-GaAs layer 23b is not covered with the silicon dioxide side walls 28 and shown through the recessed portion.

With reference to FIG. 1D, a wet etching process to the second n-GaAs layer 23b and the first n-AlGaAs layer 24a is carried out to form an under-cut recessed portion which extends under the silicon dioxide side walls 28.

With reference to FIG. 1E, a Ti/Pt/Au gate electrode film 29 is entirely deposited which extends on the center region of the first n-GaAs layer 23a and over the silicon dioxide side walls 28 as well as over the silicon oxide nitride film SiON 26.

With reference to FIG. 1F, the Ti/Pt/Au gate electrode film 29 is selectively etched by an ion-milling process to remain on the center region of the first n-GaAs layer 23a and over the silicon dioxide side walls 28 as well as over adjacent portions the silicon oxide nitride film SiON 26 to the silicon dioxide side walls 28.

With reference to FIG. 1G, the silicon oxide nitride film SiON 26 is removed. The Ti/Pt/Au gate electrode film 29 is used as a mask for deposition of AuGe/Ni/Au ohmic contacts 30 which extend over the Ti/Pt/Au gate electrode flm 29 and the n+-GaAs layers 25 except under upper-extending portions of the Ti/Pt/Au gate electrode film 29.

The required scaling down of the gate length can be obtained by conditions for forming photo-resist patterns 27, the ion reactive etching conditions to the silicon oxide nitride film SiON 26, the n+-GaAs layers 25 and the second n-AlGaAs layer 24 as well as deposition conditions to the silicon dioxide side walls 28.

The conventional method described above is disadvantageous as requiring complicated processes and highly accurate controls to opening size of opening, the thickness of the side wall Elm, the etching amount. Variations in size of the opening pattern of the photo-resist film cases variation in size of the recessed portion, resulting in enlarged variation in gate length of the gate electrode.

In the above circumstances, it had been required to develop a novel method of forming a gate electrode of a field effect transistor using an insulating film with an opening pattern free from the above disadvantages.

SUMMARY OF THE INVENTION

Accordingly, it is an object of the present invention to provide a novel method of forming a gate electrode of a field effect transistor using an insulating film with an opening pattern free from the above problems.

It is a further object of the present invention to provide a novel method of forming a gate electrode free of any variation in gate length.

It is a still further object of the present invention to provide a novel method of forming a gate electrode with reduced number of processes.

The present invention provides a method of forming a gate recess in an insulating film on a substrate for depositing a gate electrode film being in contact with a part of the substrate and also extending at least within the gate recess. The method comprises the steps of: forming an etching mask pattern with a first opening pattern on the insulating film; carrying out a first anisotropic etching process by use of the etching mask pattern at a first selective ratio of the etching mask pattern to the insulating film, thereby to form a first recessed portion having a bottom which lies at a fist level higher than an interface level between the insulating film and the substrate; and carrying out a second anisotropic etching process by use of the etching mask pattern again at a second selective ratio of the etching mask pattern to the insulating film, wherein the second selective ratio is higher than the first selective ratio, thereby to form a gate recess which comprises a second recessed portion both having a bottom which lies at the interface level and having first side walls of a first oblique angle and a third recessed portion both having a bottom united with a top of the second recessed portion and having second side walls of a second oblique angle which is smaller than the first oblique angle.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
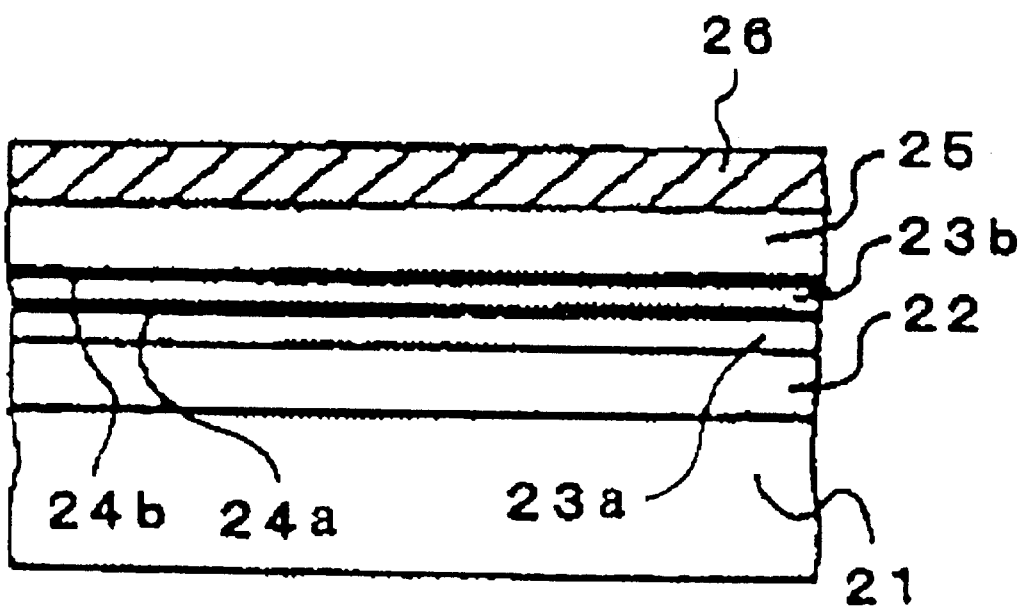
FIGS. 1A through 1G are fragmentary cross sectional elevation views illustrative of the conventional method of forming a fine and low resistive gate electrode of a field effect transistor.
Figure 1B:
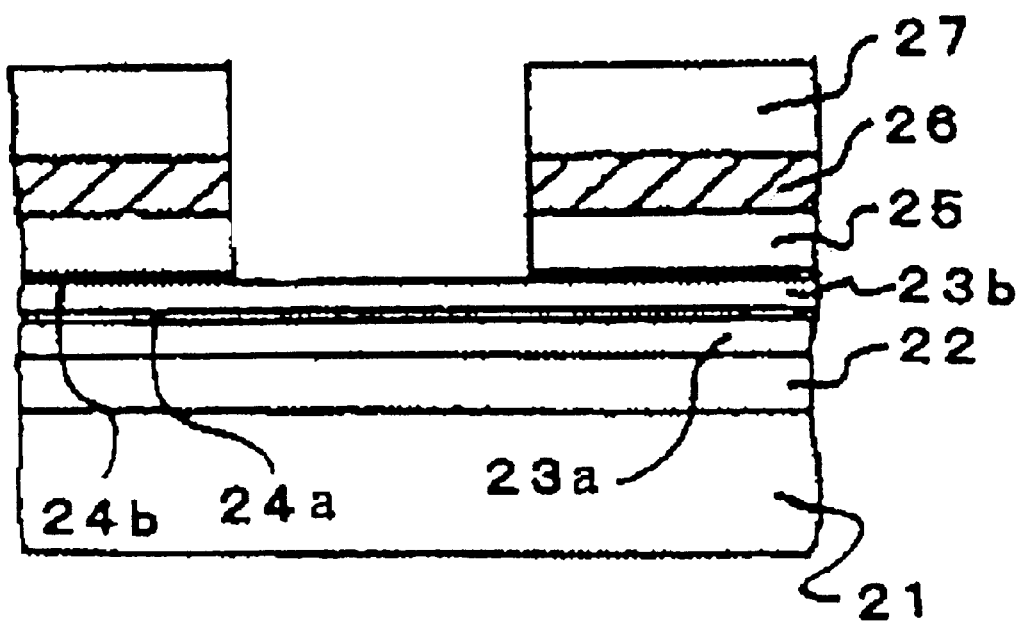
Figure 1C:
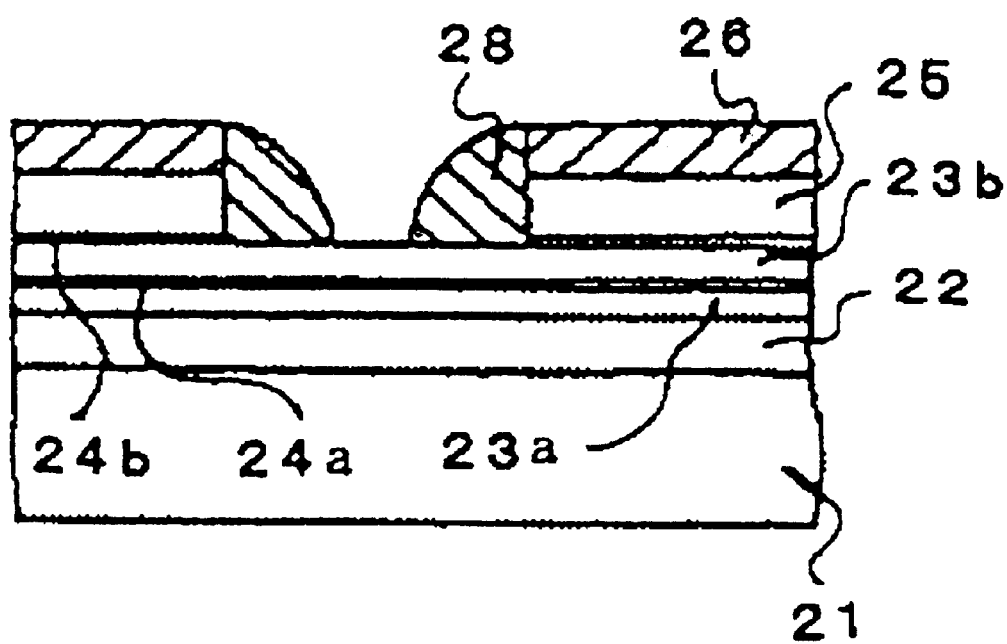
Figure 1D:
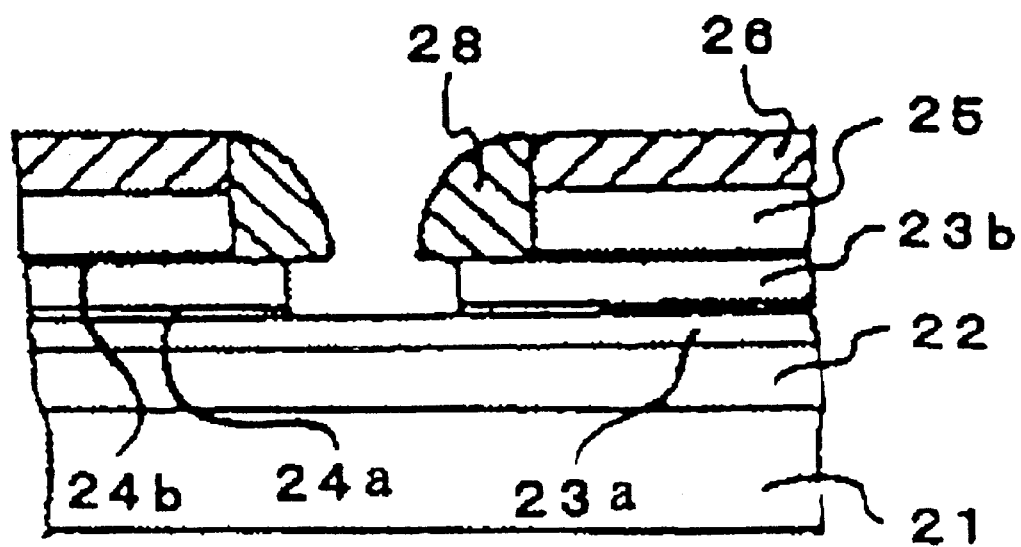
Figure 1E:
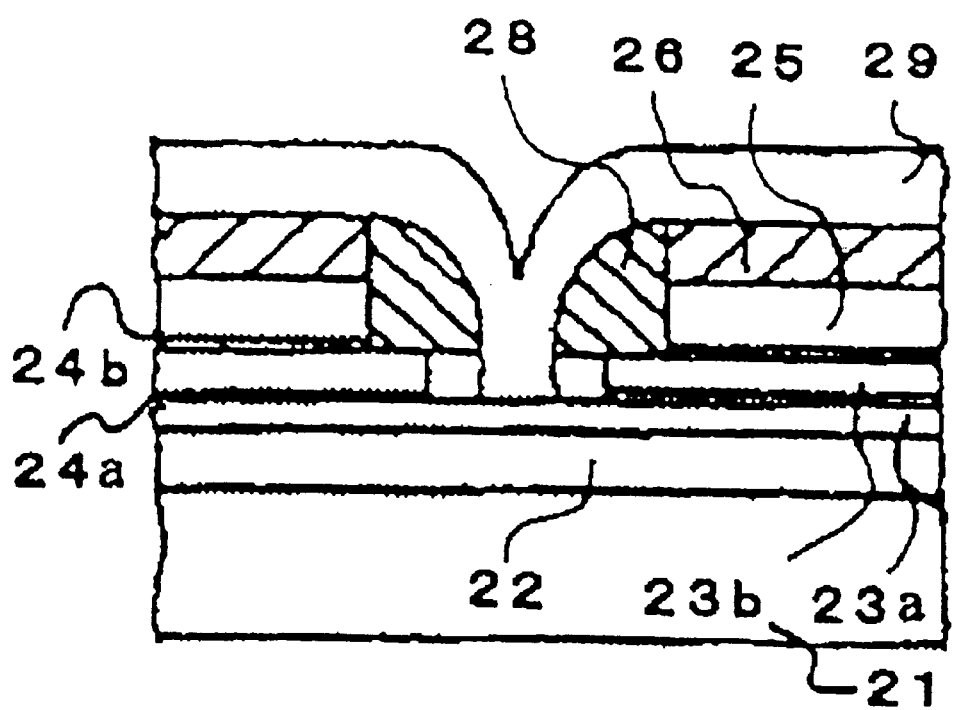
Figure 1F:
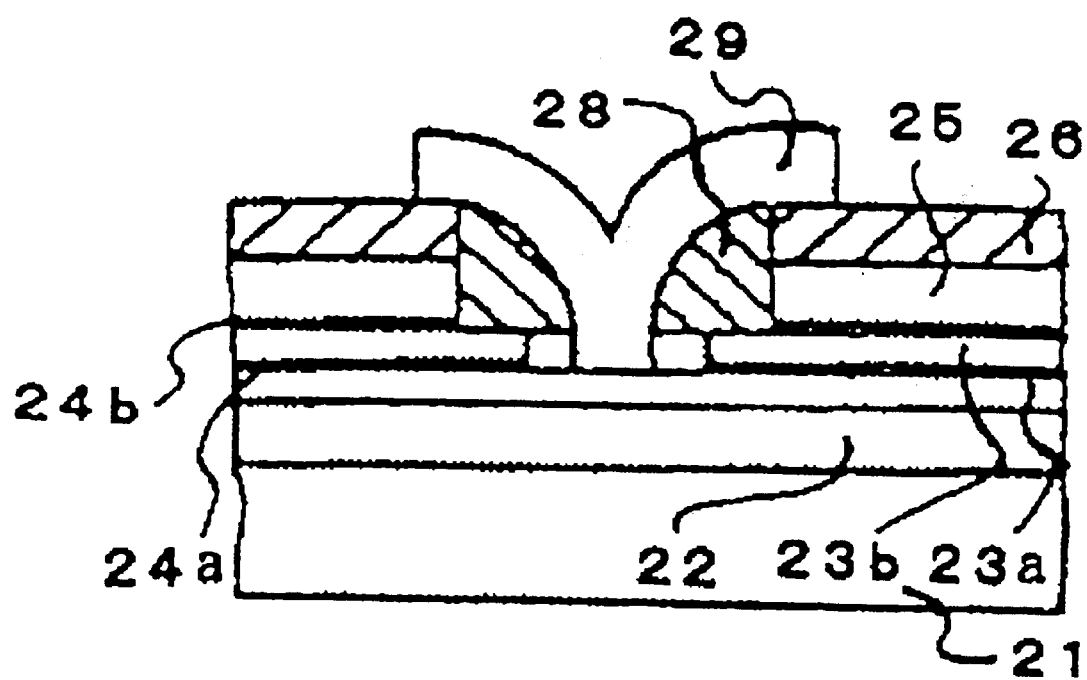
Figure 1G:
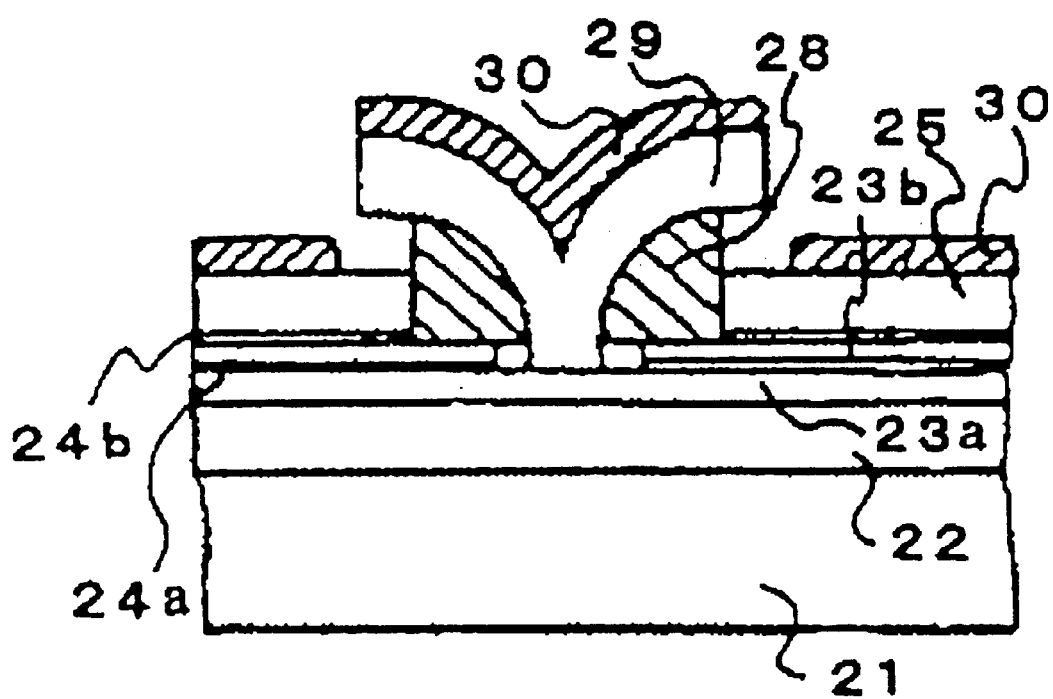

The first present invention provides a method of forming a gate recess in an insulating film on a substrate for depositing a gate electrode film being in contact with a part of the substrate and also extending at least within the gate recess. The method comprises the steps of: forming an etching mask pattern with a first opening pattern on the insulating film; carrying out a first anisotropic etching process by use of the etching mask pattern at a first selective ratio of the etching mask pattern to the insulating film, thereby to form a first recessed portion having a bottom which lies at a first level higher than an interface level between the insulating film and the substrate; and carrying out a second anisotropic etching process by use of the etching mask pattern again at a second selective ratio of the etching mask pattern to the insulating film, wherein the second selective ratio is higher than the first selective ratio, thereby to form a gate recess which comprises a second recessed portion both having a bottom which lies at the interface level and having first side walls of a first oblique angle and a third recessed portion both having a bottom united with a top of the second recessed portion and having second side walls of a second oblique angle which is smaller than the first oblique angle.

It is preferable that the first selective ratio of the first anisotropic etching process is less than 1, whilst the second selective ratio of the second anisotropic etching process is more than 1.

It is further preferable that the first oblique angle is in the range of 75–90 degrees whilst the second oblique angle is in the range of 45–70 degrees.

It is also preferable that the level of the bottom of the first recessed portion is not larger than a width of the bottom of the first recessed portion so that the bottom of the second recessed portion reaches the interface level upon the second anisotropic etching process.

It is also preferable that a depth of the second recessed portion is larger than zero and not larger than a double of a width of the bottom of the first recessed portion.

It is also preferable that an aspect ratio of the second recessed portion is not larger than 2.

It is further preferable that an aspect ratio of the second recessed portion is not larger than 1.

It is also preferable that the first opening pattern of the etching mask pattern has a size of not more than 0.4 micrometers.

It is also preferable that the etching mask pattern is made of an organic resist material.

It is also preferable that the etching mask pattern is made of a metal.

The second present invention provides a method of forming a gate electrode, comprising the steps of: forming an etching mask pattern with a first opening pattern on an insulating film on a substrate; carrying out a first anisotropic etching process by use of the etching mask pattern at a first selective ratio of the etching mask pattern to the insulating film, thereby to form a first recessed portion having a bottom which lies at a first level higher than an interface level between the insulating film and the substrate; carrying out a second anisotropic etching process by use of the etching mask pattern again at a second selective ratio of the etching mask pattern to the insulating film, wherein the second selective ratio is higher than the first selective ratio, thereby to form a gate recess which comprises a second recessed portion both having a bottom which lies at the interface level and having first side walls of a first oblique angle and a third recessed portion both having a bottom united with a top of the second recessed portion and having second side walls of a second oblique angle which is smaller than the first oblique angle; and forming a gate electrode film being in contact with the substrate and also extending at least within the gate recess.

It is preferable that the first selective ratio of the first anisotropic etching process is less than 1, whilst the second selective ratio of the second anisotropic etching process is more than 1.

It is further preferable that the first oblique angle is in the range of 75–90 degrees whilst the second oblique angle is in the range of 45–70 degrees.

It is also preferable that the level of the bottom of the first recessed portion is not larger than a width of the bottom of the first recessed portion so that the bottom of the second recessed portion reaches the interface level upon the second anisotropic etching process.

It is also preferable that a depth of the second recessed portion is larger than zero and not larger than a double of a width of the bottom of the first recessed portion.

It is also preferable that an aspect ratio of the second recessed portion is not larger than 2.

It is further preferable that an aspect ratio of the second recessed portion is not larger than 1.

It is also preferable that the first opening pattern of the etching mask pattern has a size of not more than 0.4 micrometers.

It is also preferable that the etching mask pattern is made of an organic resist material.

It is also preferable that the etching mask pattern is made of a metal.

It is also preferable to further comprise a step of removing at least underlying parts of the insulation film under the gate electrode.

The third present invention provides a gate electrode comprising at least: a first portion both having a bottom being in contact with a substrate and having first side walls which has a first constant oblique angle, wherein the bottom of the first portion is not larger in lateral size than a top of the first portion; and a second portion both having a bottom united with the top of the first portion so that the second portion is positioned over the first portion and having second side walls of a second constant oblique angle which is smaller than the first constant oblique angle, the bottom of the second portion is smaller in lateral size than a top of the second portion.

It is preferable that the first constant oblique angle is in the range of 75–90 degrees whilst the second constant oblique angle is in the range of 45–70 degrees.

It is also preferable that a ratio of height to lateral size of the first portion is not larger than 2.

It is further preferable that a ratio of height to lateral size of the first portion is not larger than 1.

It is also preferable that the bottom of the first portion has a lateral size of not more than 0.4 micrometers.

PREFERRED EMBODIMENTS

FIRST EMBODIMENT

A first embodiment according to the present invention will be described in detail with reference to FIGS. 2A through 2H which are fragmentary cross sectional elevation views illustrative of a first novel method of forming a fine and low resistive gate electrode of a field effect transistor in a first embodiment in accordance with the present invention.

Figure 2A:
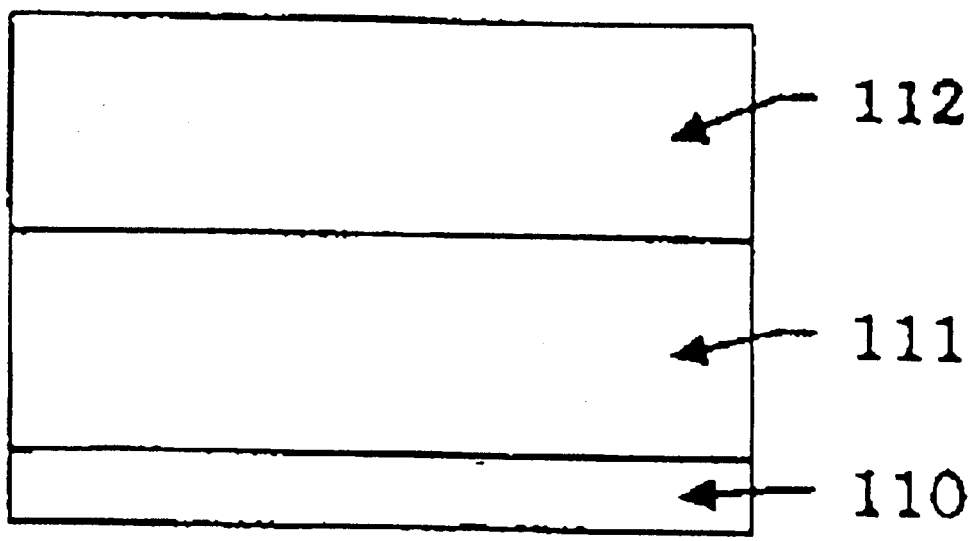
FIGS. 2A through 2H are fragmentary cross sectional elevation views illustrative of a first novel method of forming a fine and low resistive gate electrode of a field effect transistor in a first embodiment in accordance with the present invention.

With reference to FIG. 2A, an insulating film 111 having a thickness of 300 nanometers is formed on a semiconductor substrate 110. A photo-resist 112 having a thickness of 100 nanometers for electron beam is formed on the insulating film 111.

Figure 2B:
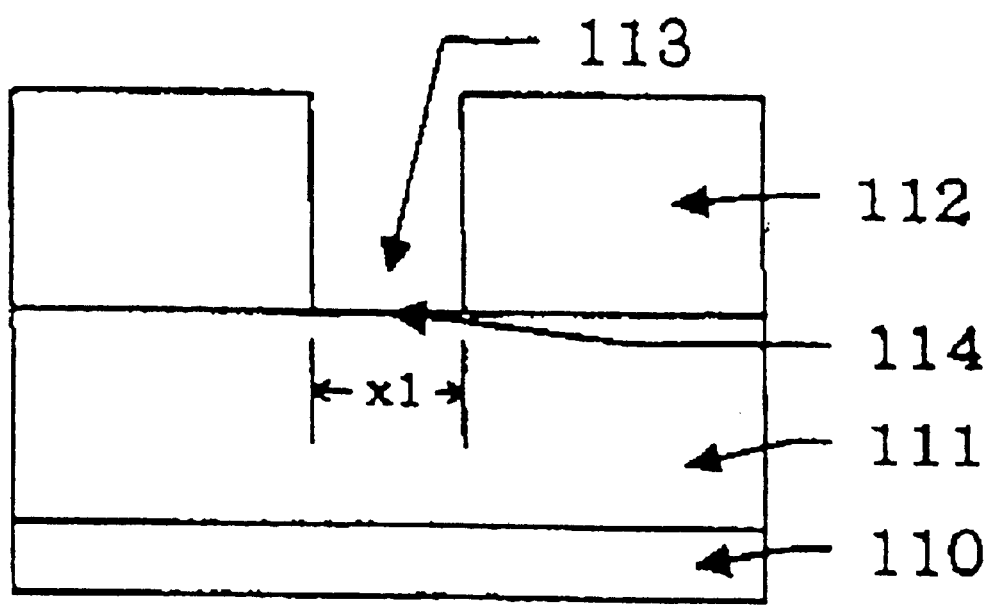

With reference to FIG. 2B, an opening pattern 113 is formed in the photo-resist 112 so that a predetermined gate region 114 with a first bottom width of "X1" of the insulating film 111 is shown through the opening pattern 113, whereby forming a photo-resist pattern 112 with the opening pattern 113.

Figure 2C:
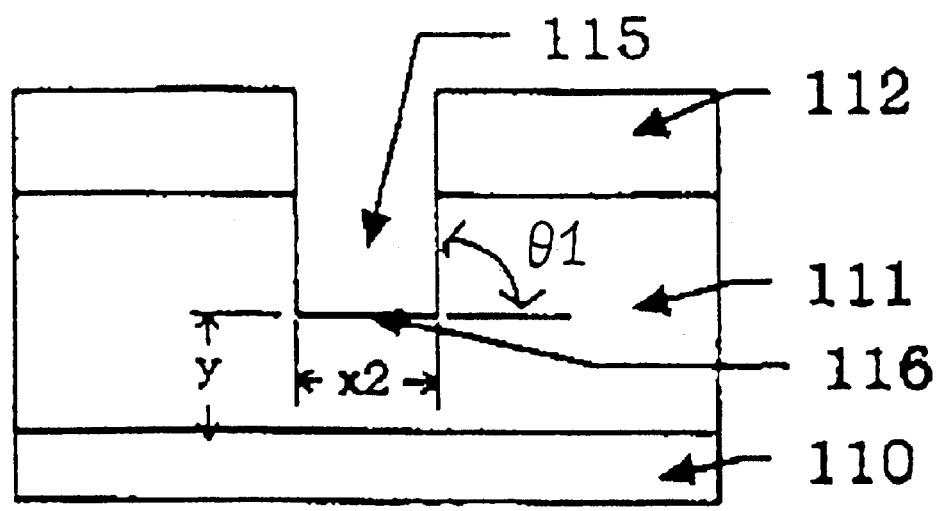

With reference to FIG. 2C, the photo-resist pattern 112 is used for carrying out a first dry etching, such as an ion reactive etching using $CF_4$, $C_2F_4$, or $CHF_3$, to the insulating film 111 at a selective etching ratio of less than 1 of the photo-resist pattern 112 to the insulating film 111 to form a first recessed pattern 115 in the insulating film 111, wherein the first recessed pattern 115 has a second bottom width of "X2" and side walls which have an oblique angle θ1 in the range of 75–90 degrees. The illustration is in the case of 90 degrees. The bottom of the first recessed pattern 115 has a level "y" from the interface between the substrate 110 and the insulating film 111, wherein the level "y" is not larger than the double of the second bottom width of "X2". If the oblique angle θ is 90 degrees, then the second bottom width of "X2" is equal to the first bottom width of "X1".

Figure 2D:
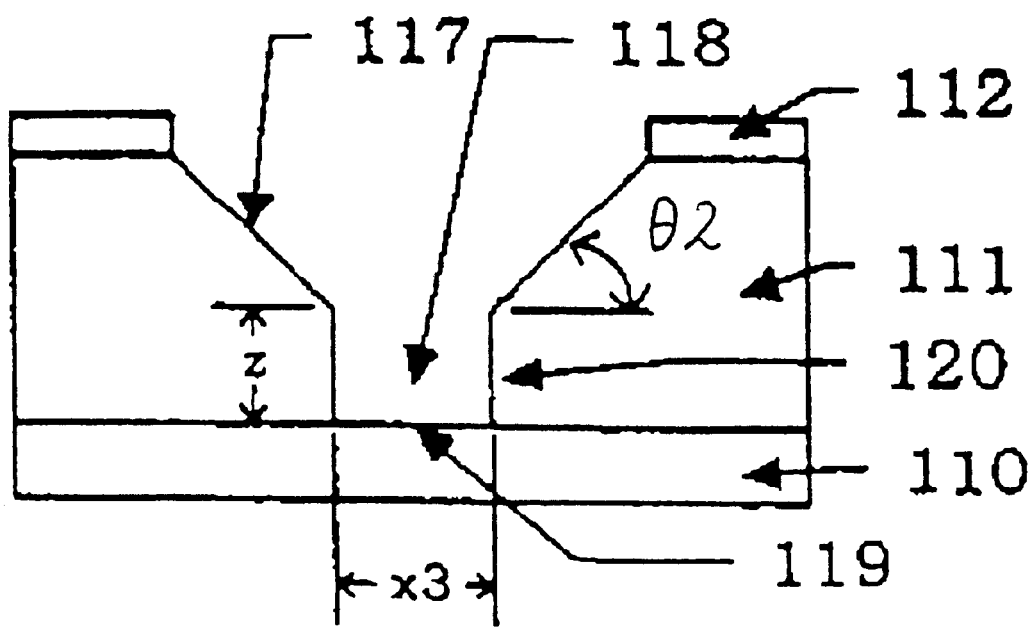
Figure 3:
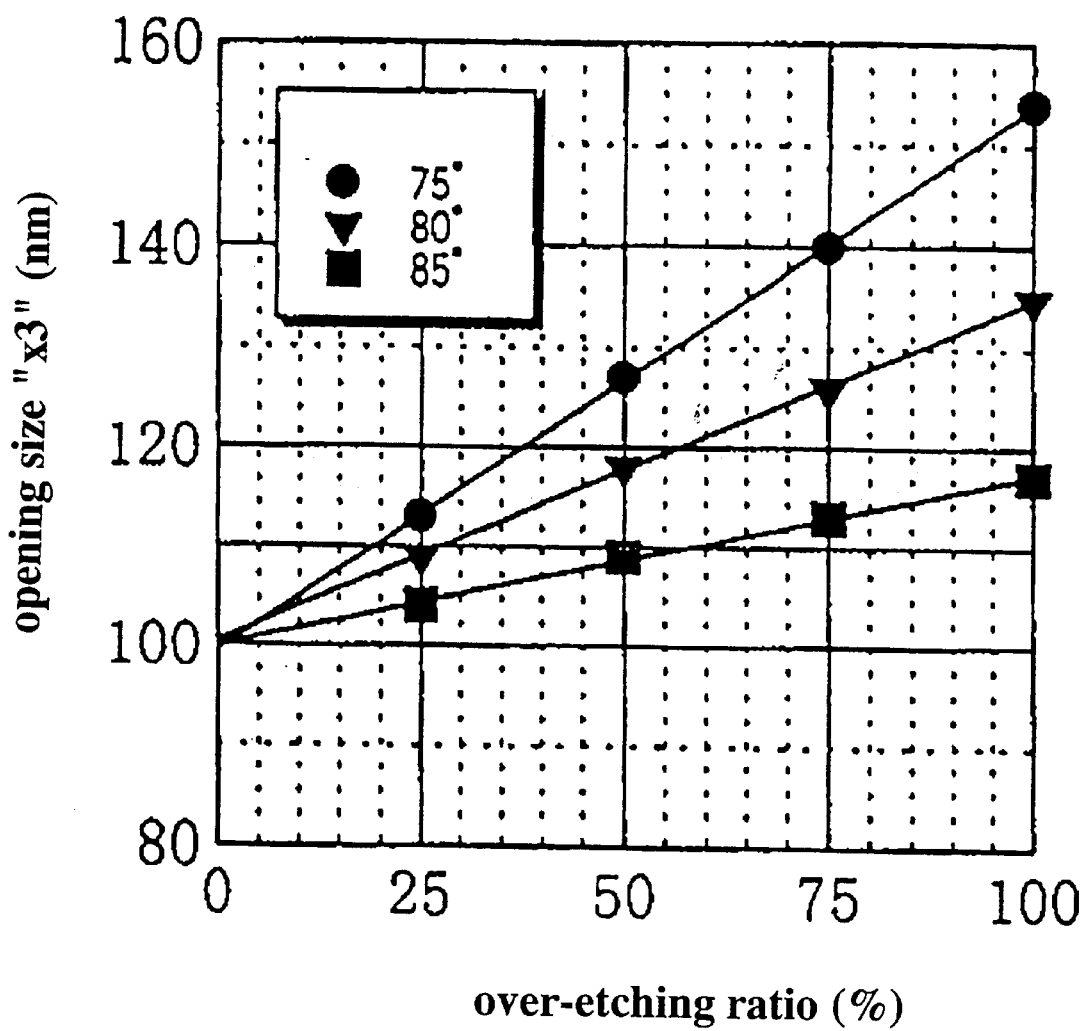
FIG. 3 is a diagram illustrative of variation in opening size "x3" of the third recessed pattern versus over-etching ratio of excess etching amount to the etching amount to the remaining thickness 150 nanometers of the insulating film when the second bottom width was 100 nanometers, wherein ● is in a case of the above first oblique angle $\theta 1$ is 75 degrees, ▼ is in a case of the above first oblique angle $\theta 1$ is 80 degrees, and ■ is in a case of the above first oblique angle $\theta 1$ is 85 degrees.
Figure 4:
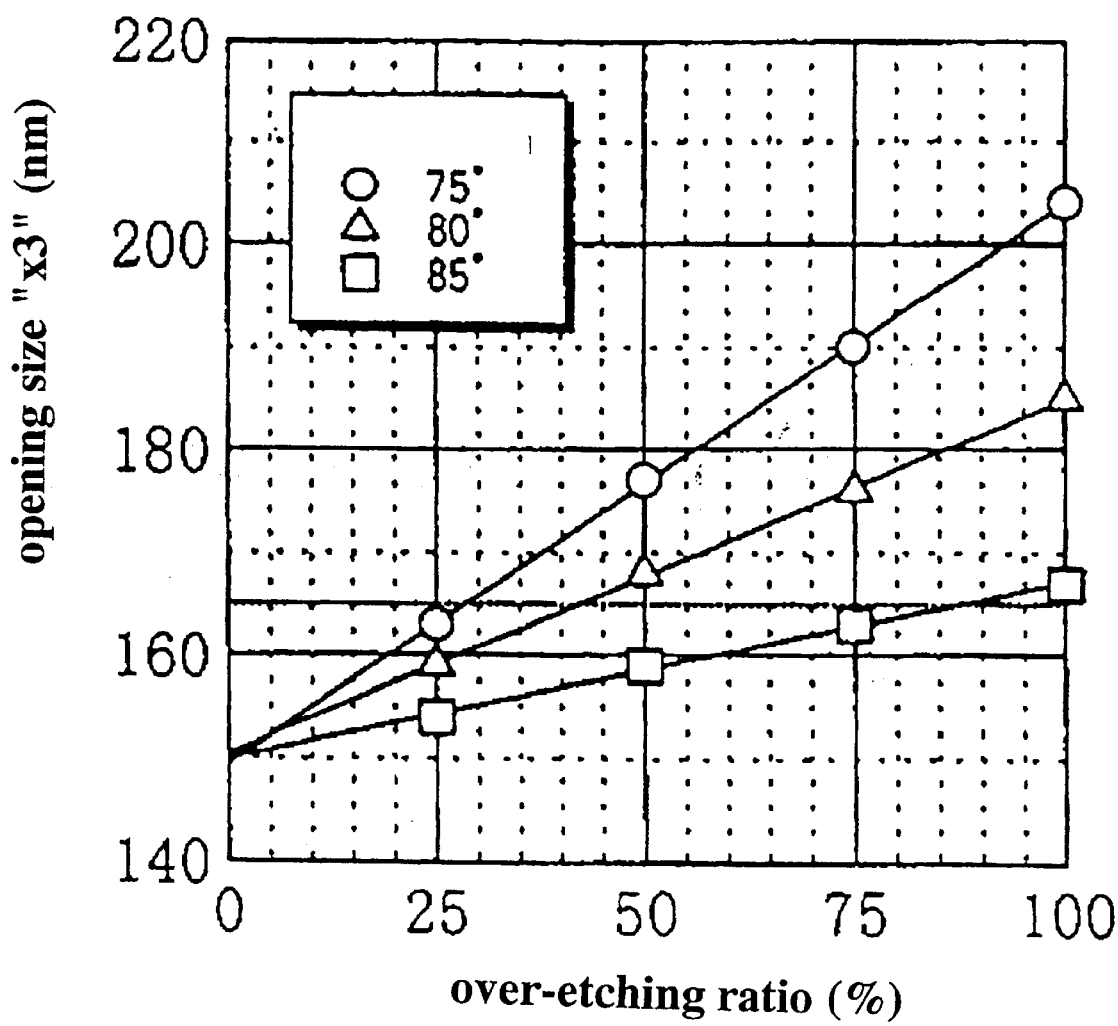
FIG. 4 is a diagram illustrative of variation in opening size "x3" of the third recessed pattern versus over-etching ratio of excess etching amount to the etching amount to the remaining thickness 150 nanometers of the insulating film when the second bottom width was 150 nanometers, wherein ○ is in a case of the above first oblique angle $\theta 1$ is 75 degrees, Δ is in a case of the above first oblique angle $\theta 1$ is 80 degrees, and □ is in a case of the above first oblique angle $\theta 1$ is 85 degrees.

With reference to FIG. 2D, the photo-resist pattern 112 is again used for carrying out a second dry etching, such as an electron cyclotron resonance plasma enhanced etching using $SF_6$, to the insulating film 111 at a second selective etching ratio of more than 1 of the photo-resist pattern 112 to the insulating film 111 to form second and third recessed patterns 117 and 118 in the insulating film 111. The second recessed pattern 117 has sloped side walls which have an oblique angle θ2 in the range of 45–70 degrees. The third recessed pattern 118 is formed by etching down the bottom of the first recessed pattern 115 so that a surface of the silicon substrate 110 is shown. The third recessed pattern 118 also has vertical side walls. A boundary between the sloped side wall of the second recessed pattern 117 and the vertical side wall of the third recessed pattern 118 has a level "z" from the interface between the substrate 110 and the insulating film 111, wherein the level "z" is not larger than the double of the second bottom width of "X2" and more than zero. After the bottom of the third recessed pattern 118 has reached the surface of the substrate 110, the surface of the substrate is not etched whilst the etching direction is changed toward lateral direction so that an opening size "x3" of the third opening pattern 118 is enlarged in proportional to an excess etching amount after the bottom of the third recessed pattern 118 has just reached the surface of the substrate 110. The opening size "x3" of the third recessed pattern 118 is proportional to an over-etching ratio of excess etching amount to the etching amount to the remaining thickness 150 nanometers of the insulating film 111. FIG. 3 is a diagram illustrative of variation in opening size "x3" of the third recessed pattern versus over-etching ratio of excess etching amount to the etching amount to the remaining thickness 150 nanometers of the insulating film when the second bottom width was 100 nanometers, wherein ● is in a case of the above first oblique angle θ1 is 75 degrees, ▼ is in a case of the above first oblique angle θ1 is 80 degrees, and ■ is in a case of the above first oblique angle θ1 is 85 degrees. FIG. 4 is a diagram illustrative of variation in opening size "x3" of the third recessed pattern versus over-etching ratio of excess etching amount to the etching amount to the remaining thickness 150 nanometers of the insulating film when the second bottom width was 150 nanometers, wherein ○ is in a case of the above first oblique angle θ1 is 75 degrees, Δ is in a case of the above first oblique angle θ1 is 80 degrees, and □ is in a case of the above first oblique angle θ1 is 85 degrees. If, for example, the bottom width "X2" of the first opening pattern 115 is 100 nanometers and the level "y" of the bottom 116 of the first opening pattern 115 from the surface of the substrate 110 is 100 nanometers and the first oblique angle θ1 is 75 degrees, then the opening size "x3" of the third recessed pattern 118 is within 10% in dimensional variation ratio of the bottom width of "X1" of the opening pattern 113 even the over-etching ratio is 20%, wherein the dimensional variation ratio is defined to be (x3−x1)/x1. If the above first oblique angle θ1 is increased to 90 degrees, then the acceptable over-etching ratio for obtaining not more than 10% dimensional variation ratio is also increased from 20%. If, for example, the bottom width "X2" of the first opening pattern 115 is 150 nanometers and the level "y" of the bottom 116 of the first opening pattern 115 from the surface of the substrate 110 is 100 nanometers and the first oblique angle θ1 is 75 degrees, then the opening size "x3" of the third recessed pattern 118 is within 10% in dimensional variation ratio of the bottom width of "X1" of the opening pattern 113 even the over-etching ratio is 30%, wherein the dimensional variation ratio is defined to be (x3−x1)/x1. If the above first oblique angle θ1 is increased to 90 degrees, then the acceptable over-etching ratio for obtaining not more than 10% dimensional variation ratio is also increased from 30%.

Namely, even if the over-etching ratio is 20%, then the opening size "x3" of the third recessed pattern 118 is within 10% in dimensional variation ratio of the bottom width of "X1" of the opening pattern 113. The opening size "x3" of the third recessed pattern 118 finally defines the gate length. Particularly, when the bottom width of "X1" of the opening pattern 113 of the photo-resist is within 0.4 micrometers, then the reduction in dimension or size of the opening pattern causes a delay in etching rate of the insulating film due to micro-loading effect. This makes it difficult to realize a high accurate control to the etching depth of the insulating film. The above novel method enlarges the acceptable over-etching ratio for obtaining not more than 10% dimensional variation ratio.

If an aspect ratio of z/x3 of the third recessed pattern 118 is not higher than 2, then it is possible to bury a metal layer within the third recessed pattern 118 without disconnection. Further if the aspect ratio of z/x3 of the third recessed pattern 118 is not higher than 1, then the yield of the gate electode is increased.

Figure 5:
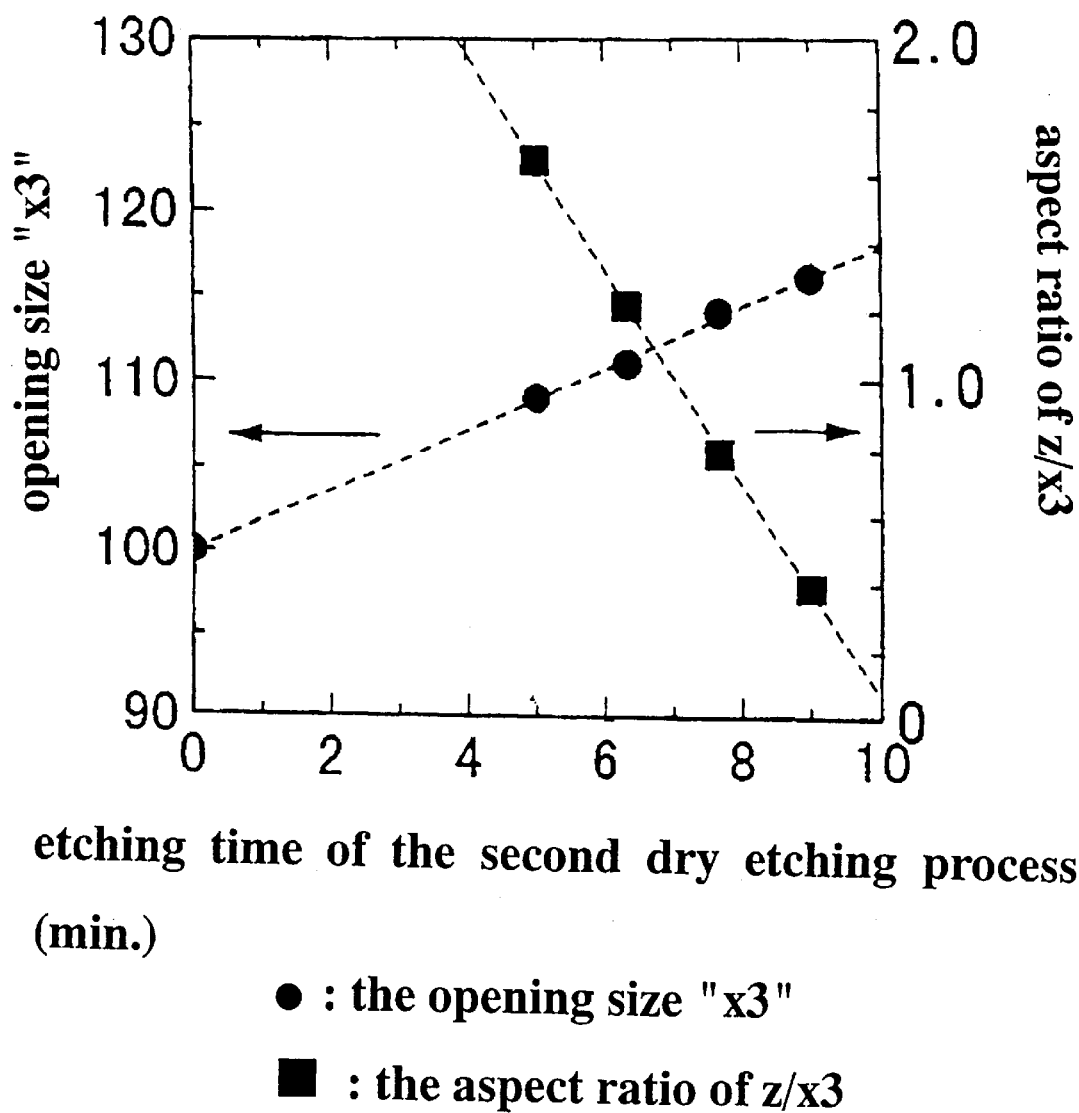
FIG. 5 is a diagram illustrative of variations in opening size "x3" of the third recessed pattern over the etching time of the second dry etching process and also illustrative of variations in aspect ratio of z/x3 of the third recessed pattern over the etching time of the second dry etching process, wherein ● represents the opening size "x3" whilst ■ represents the aspect ratio of z/x3.

FIG. 5 is a diagram illustrative of variations in opening size "x3" of the third recessed pattern over the etching time of the second dry etching process and also illustrative of variations in aspect ratio of z/x3 of the third recessed pattern over the etching time of the second dry etching process, wherein ● represents the opening size "x3" whilst ■ represents the aspect ratio of z/x3.

Figure 2E:
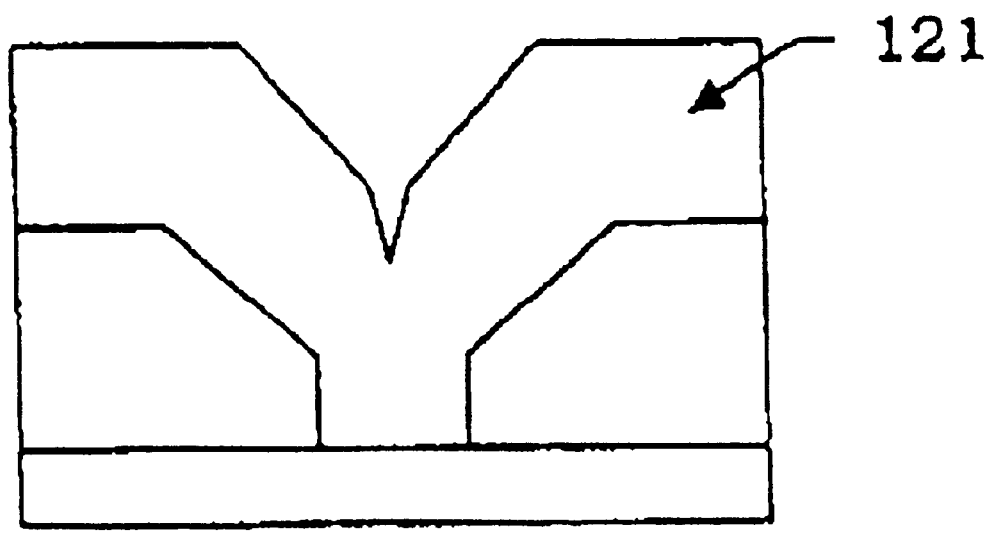

With reference to FIG. 2E, the positive-type photo-resist 112 is removed by an oxygen plasma etching process and subsequent organic cleaning process from the insulating film 111. A WSi/Au gate metal film 121 is deposited by a sputtering method to bury the second and third opening patterns 117 and 118.

Figure 2F:
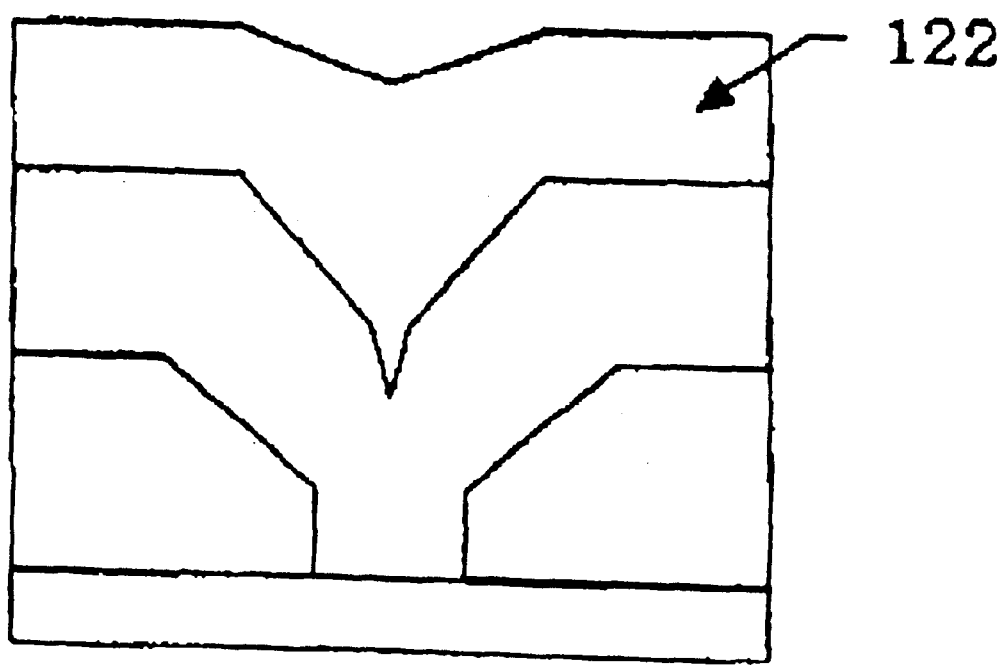

With reference to FIG. 2F, a second photo-resist 122 having a thickness of 1 micrometer for i-ray exposure is applied on the gate metal film 121.

Figure 2G:
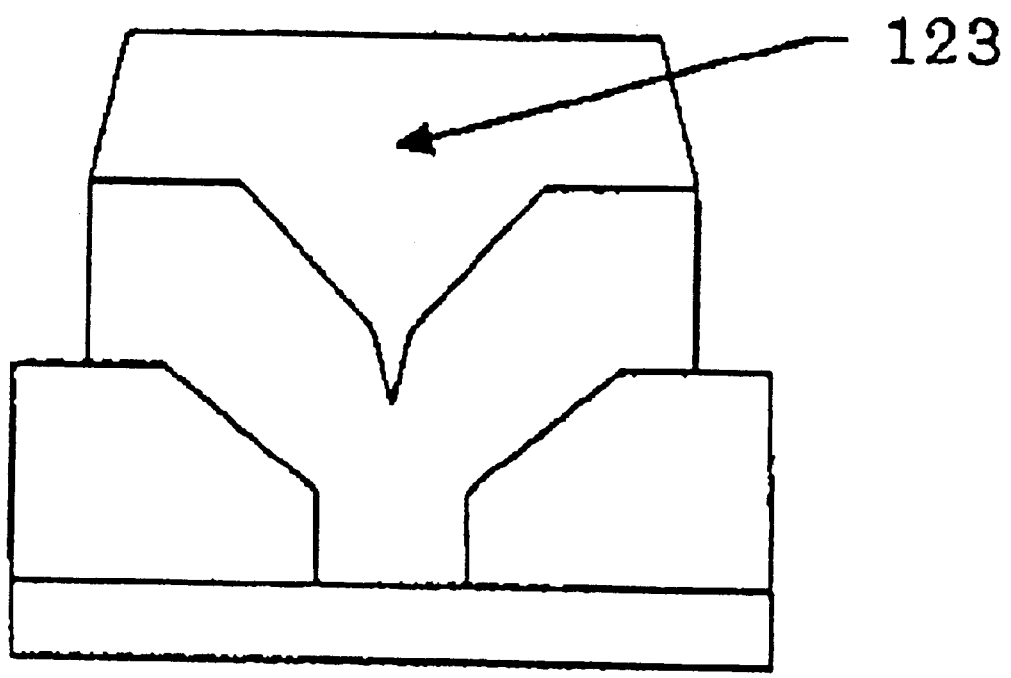

With reference to FIG. 2G, the second photo-resist 122 is patterned to form a negative-type photo-resist pattern 123 with a 800 nanometers dimension or size. The negative-type photo-resist pattern 123 is used for selectively etching the gate metal film 121 with a reactive ion etching or an ion milling process to form a Schottky gate electrode 124.

Figure 2H:
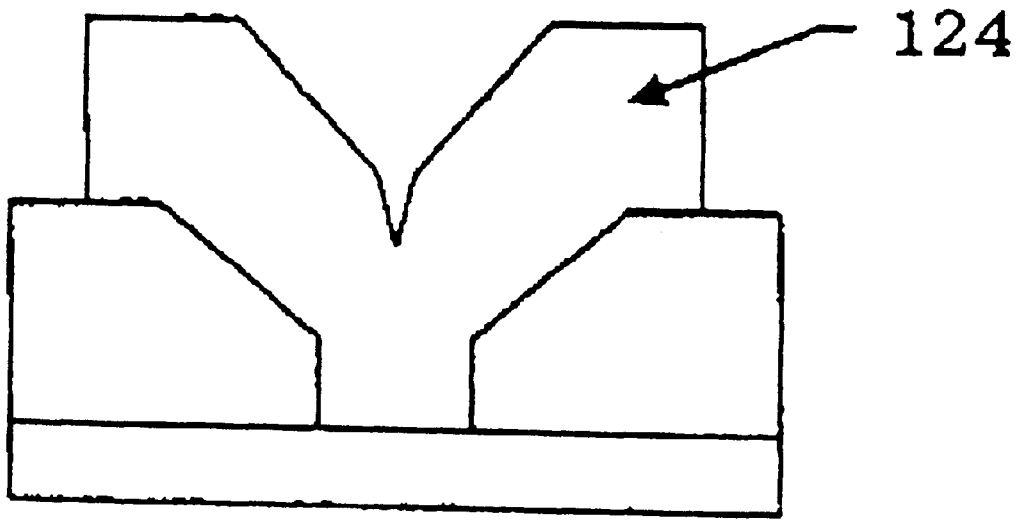

With reference to FIG. 2H the used negative-type photo-resist pattern 123 is then removed by an oxygen plasma aching process and subsequent organic cleaning process.

As a modification to the above first embodiment, in place of the silicon dioxide insulating film 111, a silicon nitride insulating film or a silicon oxide and nitride film is also available.

As a further modification to the above first embodiment, in place of the electron beam exposure etching mask 112, an i-ray exposure etching mask is also available to form 400 nanometers opening 113.

As a further more modification to the above first embodiment, in place of the electron beam exposure etching mask 112, a KrF laser beam exposure etching mask is also available to form 200 nanometers opening 113.

As a still further modification to the above first embodiment, in place of the reactive ion etching process for forming the first opening pattern 115, a magnetron reactive ion etching process, an electron cyclotron resonance plasma enhanced etching process or an inductive coupled plasma enhanced etching process is also available.

As yet further modification to the above first embodiment, in place of the electron cyclotron resonance plasma enhanced etching process for forming the second opening pattern 117, a magnetron reactive ion etching process, a reactive ion etching process or an inductive coupled plasma enhanced etching process is also available.

As moreover modification to the above first embodiment, in place of the i-ray exposure etching mask 122, a g-ray exposure etching mask or an electron beam exposure etching mask is also available.

SECOND EMBODIMENT

A second embodiment according to the present invention will be described in detail with reference to FIGS. 6A through 6H which are fragmentary cross sectional elevation views illustrative of a second novel method of forming a fine and low resistive gate electrode of a field effect transistor in a second embodiment in accordance with the present invention.

Figure 6A:
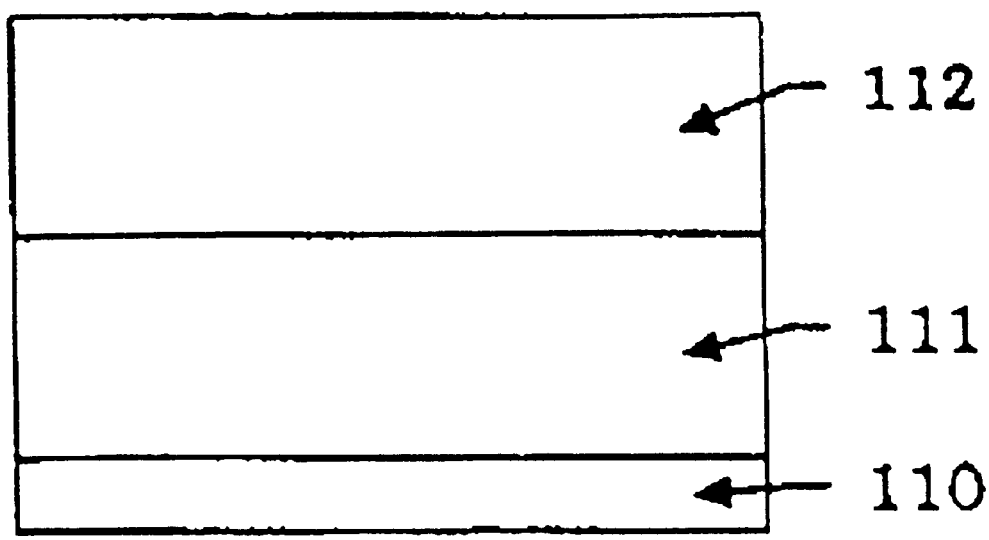
FIGS. 6A through 6H are fragmentary cross sectional elevation views illustrative of a second novel method of forming a fine and low resistive gate electrode of a field effect transistor in a second embodiment in accordance with the present invention.

With reference to FIG. 6A, an insulating film 111 having a thickness of 300 nanometers is formed on a semiconductor substrate 110. A photo-resist 112 having a thickness of 100 nanometers for electron beam is formed on the insulating film 111.

Figure 6B:
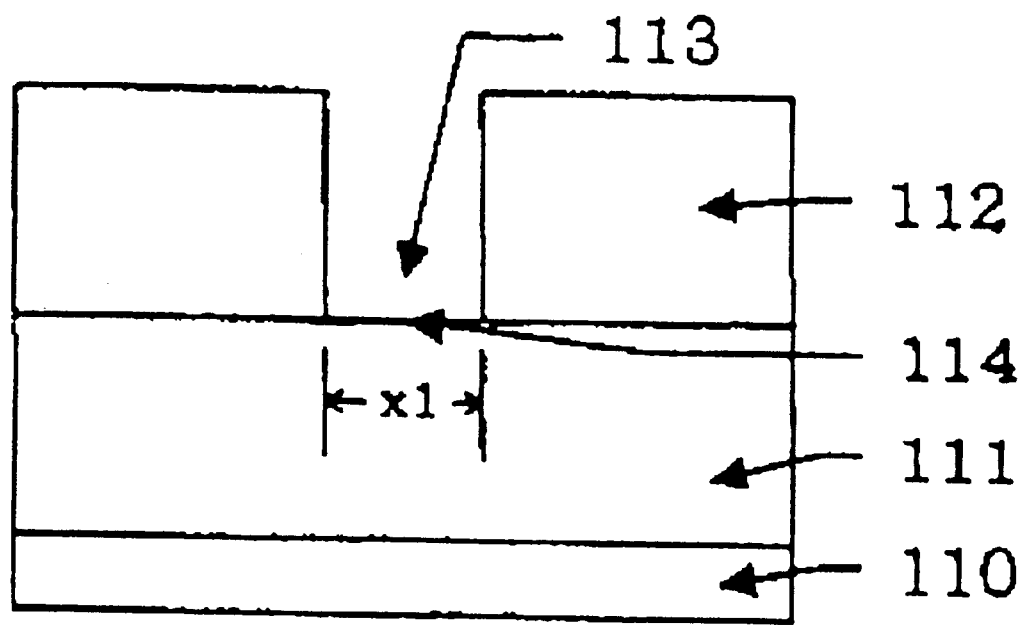

With reference to FIG. 6B, an opening pattern 113 is formed in the photo-resist 112 so that a predetermined gate region 114 with a first bottom width of "X1" of the insulating film 111 is shown through the opening pattern 113, whereby forming a photo-resist pattern 112 with the opening pattern 113.

Figure 6C:
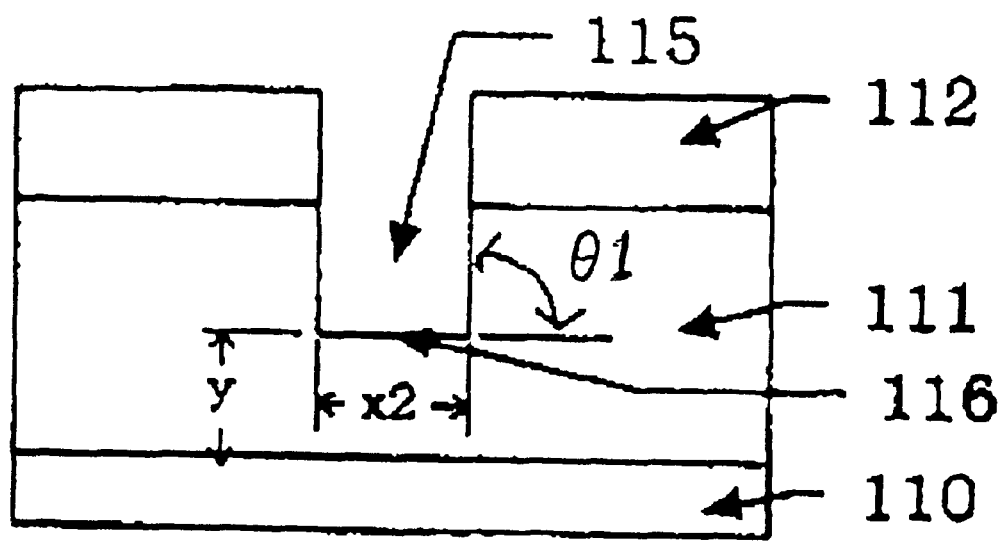

With reference to FIG. 6C, the photo-resist pattern 112 is used for carrying out a first dry etching, such as an ion reactive etching using $CF_4$, $C_2F_4$, or $CHF_3$, to the insulating film 111 at a selective etching ratio of less than 1 of the photo-resist pattern 112 to the insulating film 111 to form a first recessed pattern 115 in the insulating film 111, wherein the first recessed pattern 115 has a second bottom width of "X2" and side walls which have an oblique angle θ1 in the range of 75–90 degrees. The illustration is in the case of 90 degrees. The bottom of the first recessed pattern 115 has a level "y" from the interface between the substrate 110 and the insulating film 111, wherein the level "y" is not larger than the double of the second bottom width of "X2". If the oblique angle θ is 90 degrees, then the second bottom width of "X2" is equal to the first bottom width of "X1".

Figure 6D:
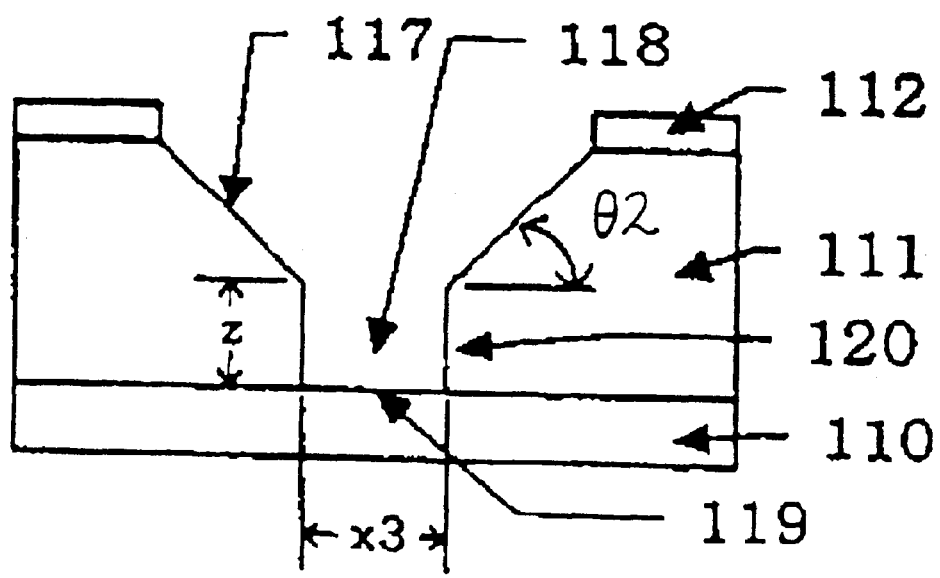

With reference to FIG. 6D, the photo-resist pattern 112 is again used for carrying out a second dry etching, such as an electron cyclotron resonance plasma enhanced etching using $SF_6$, to the insulating film 111 at a second selective etching ratio of more than 1 of the photo-resist pattern 112 to the insulating film 111 to form second and third recessed patterns 117 and 118 in the insulating film 111. The second recessed pattern 117 has sloped side wails which have an oblique angle θ2 in the range of 45–70 degrees. The third recessed pattern 118 is formed by etching down the bottom of the first recessed pattern 115 so that a surface of the silicon substrate 110 is shown. The third recessed pattern 118 also has vertical side walls. A boundary between the sloped side wall of the second recessed pattern 117 and the vertical side wall of the third recessed pattern 118 has a level "z" from the interface between the substrate 110 and the insulating film 111, wherein the level "z" is not larger than the double of the second bottom width of "X2" and more than zero. After the bottom of the third recessed pattern 118 has reached the surface of the substrate 110, the surface of the substrate is not etched whilst the etching direction is changed toward lateral direction so that an opening size "x3" of the third opening pattern 118 is enlarged in proportional to an excess etching amount after the bottom of the third recessed pattern 118 has just reached the surface of the substrate 110. The opening size "x3" of the third recessed pattern 118 is proportional to an over-etching ratio of excess etching amount to the etching amount to the remaining thickness 150 nanometers of the insulating film 111.

Figure 6E:
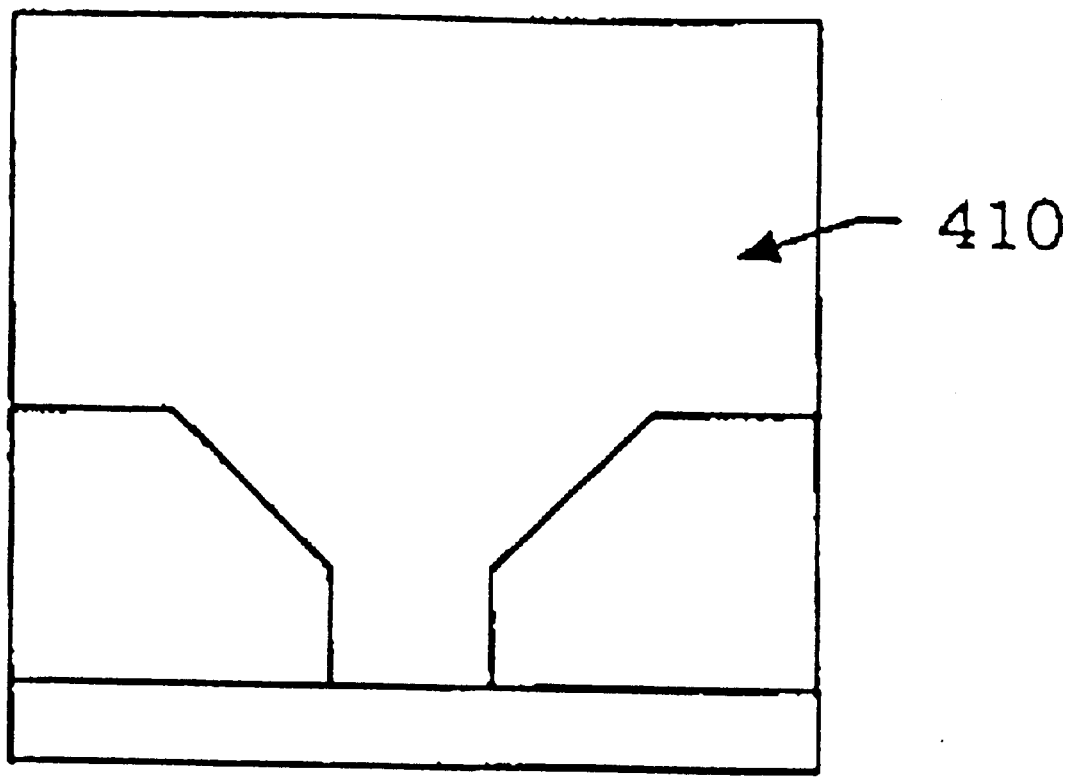

With reference to FIG. 6E, an i-ray exposure resist film 410 is applied to bury the same within the second and third opening patterns 117 and 118.

Figure 6F:
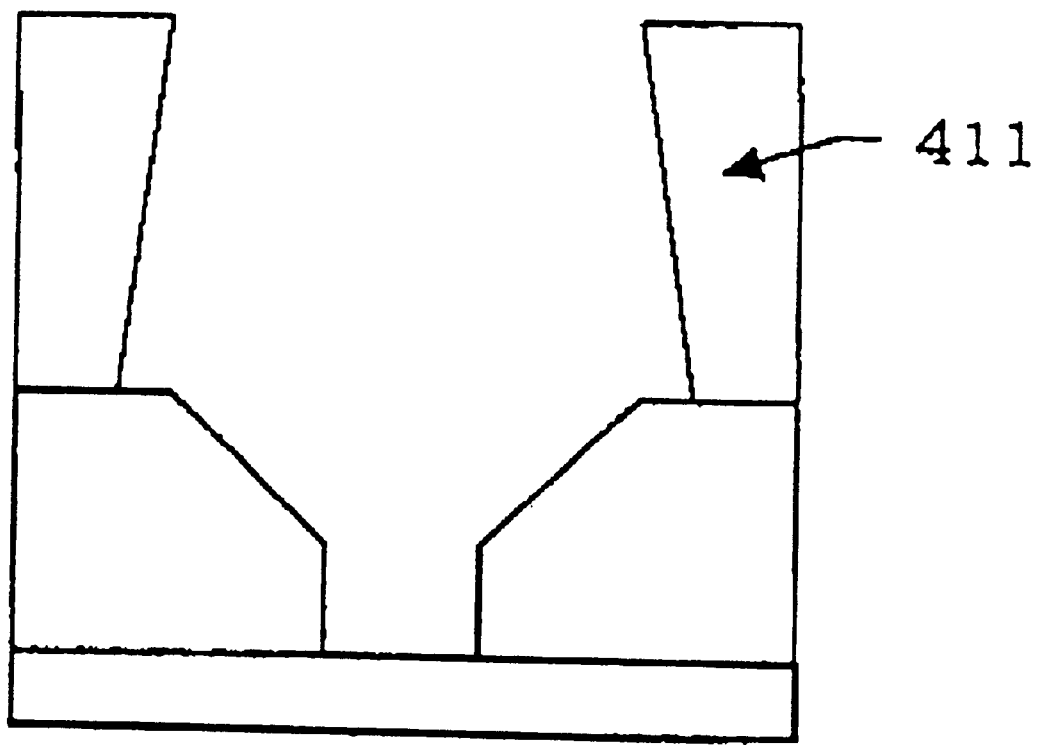

With reference to FIG. 6F, the i-ray exposure resist film 410 is subsequent exposed to the i-ray to form a second opening pattern 411 in the i-ray exposure resist film 410 so that the second opening pattern 411 has an opening size or dimension of 800 nanometers.

Figure 6G:
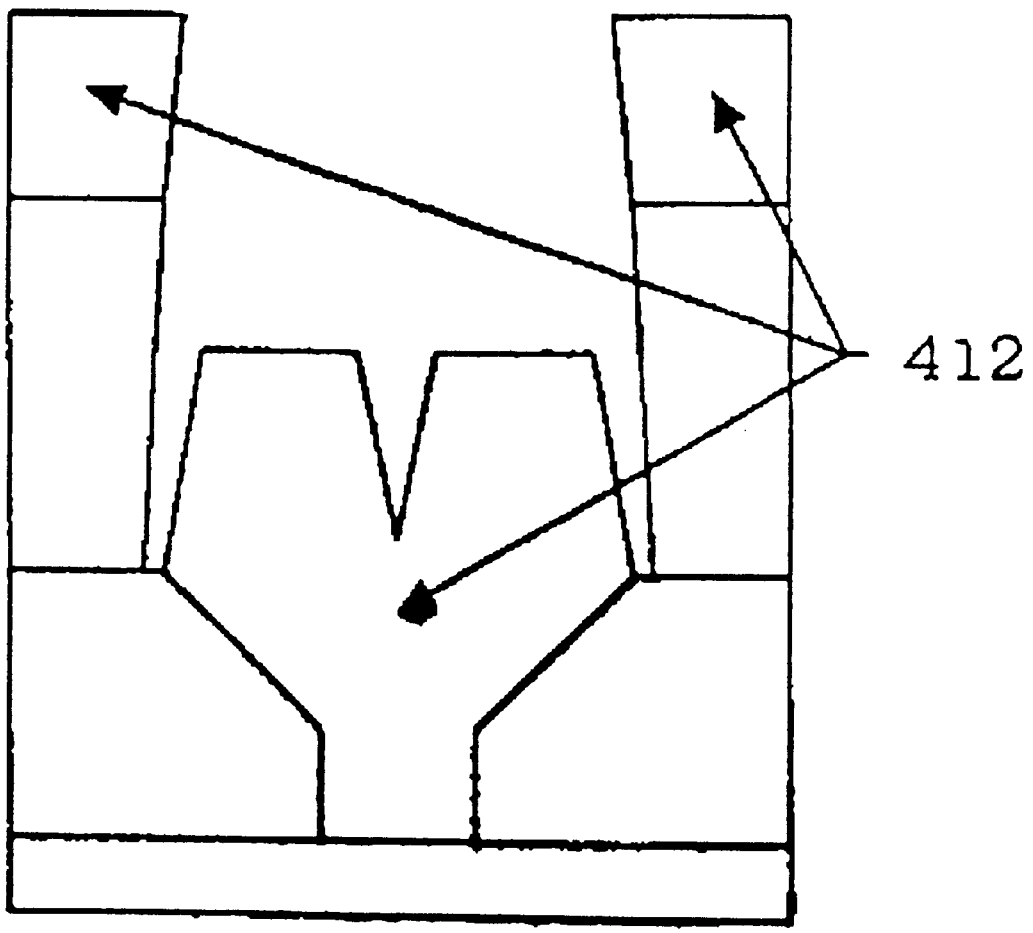

With reference to FIG. 6G, an electron gun deposition method is carried out to deposit a Ti/Au gate metal film 412 to bury the second opening pattern 411 and extends on the second opening pattern 411.

Figure 6H:
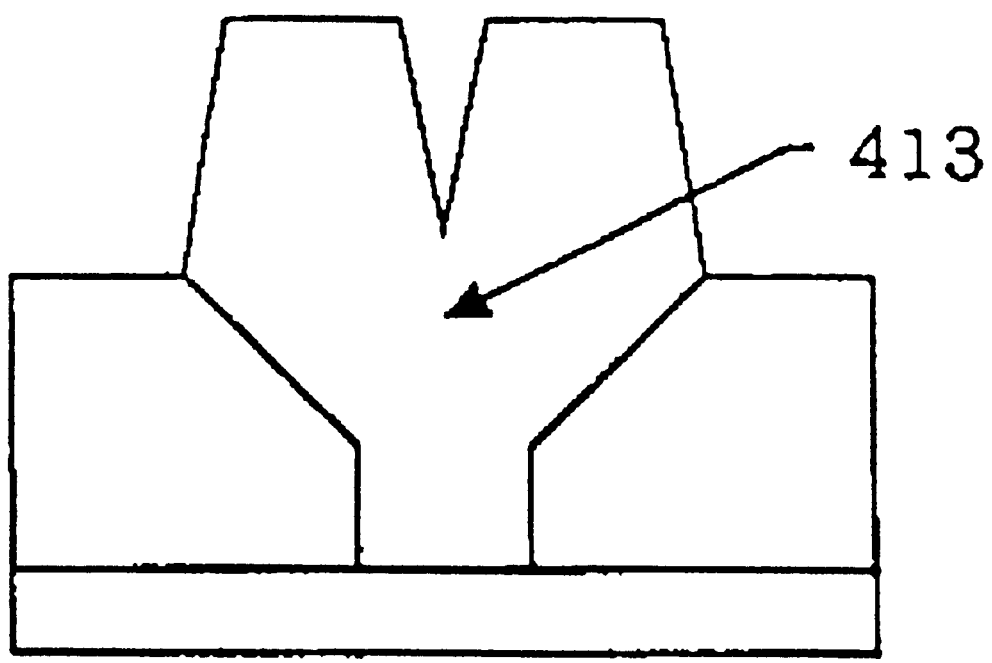

With reference to FIG. 6H, the Ti/Au gate metal film 412 and the i-ray exposure resist film 410 are then subjected to a resist lift-off process to be selectively removed thereby to form a Schottky gate electrode 413.

As a modification to the above second embodiment, in place of the silicon dioxide insulating film 111, a silicon nitride insulating film or a silicon oxide and nitride film is also available.

As a further modification to the above second embodiment, in place of the electron beam exposure etching mask 112, an i-ray exposure etching mask is also available to form 400 nanometers opening 113.

As a further more modification to the above second embodiment, in place of the electron beam exposure etching mask 112, a KrF laser beam exposure etching mask is also available to form 200 nanometers opening 113.

As a still further modification to the above second embodiment, in place of the reactive ion etching process for forming the first opening pattern 115, a magnetron reactive ion etching process, an electron cyclotron resonance plasma enhanced etching process or an inductive coupled plasma enhanced etching process is also available.

As yet further modification to the above second embodiment, in place of the electron cyclotron resonance plasma enhanced etching process for forming the second opening pattern 117, a magnetron reactive ion etching process, a reactive ion etching process or an inductive coupled plasma enhanced etching process is also available.

As moreover modification to the above second embodiment, in place of the i-ray exposure etching mask 122, a g-ray exposure etching mask or an electron beam exposure etching mask is also available.

As still more modification to the above second embodiment, in place of the i-ray exposure resist 410, a g-ray exposure resist or an electron can exposure resist is also available.

THIRD EMBODIMENT

A third embodiment according to the present invention will be described in detail with reference to FIGS. 7A through 7I which are fragmentary cross sectional elevation views illustrative of a first novel method of forming a fine and low resistive gate electrode of a field effect transistor in a third embodiment in accordance with the present invention.

Figure 7A:
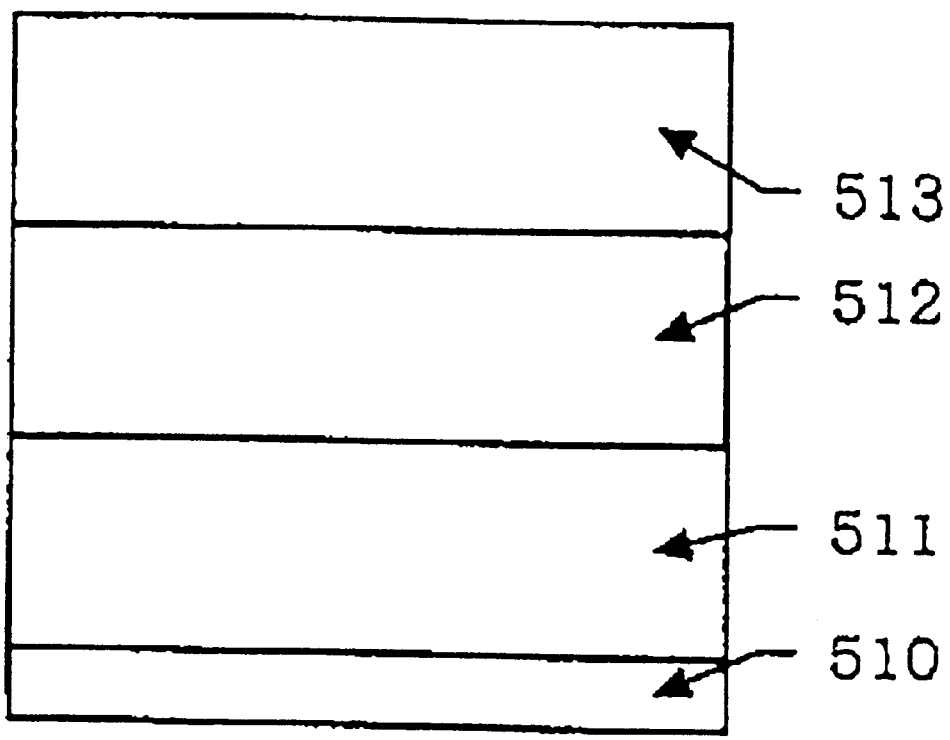
FIGS. 7A through 7I are fragmentary cross sectional elevation views illustrative of a first novel method of forming a fine and low resistive gate electrode of a field effect transistor in a third embodiment in accordance with the present invention.

With reference to FIG. 7A, an insulating film 511 having a thickness of 300 nanometers is formed on a semiconductor substrate 510. A WSi film 512 having a thickness of 300 nanometers is deposited on the insulating film 511 by a sputtering method. A electron beam exposure-resist 513 having a thickness of 300 nanometers for electron beam is formed on the WSi film 512.

Figure 7B:
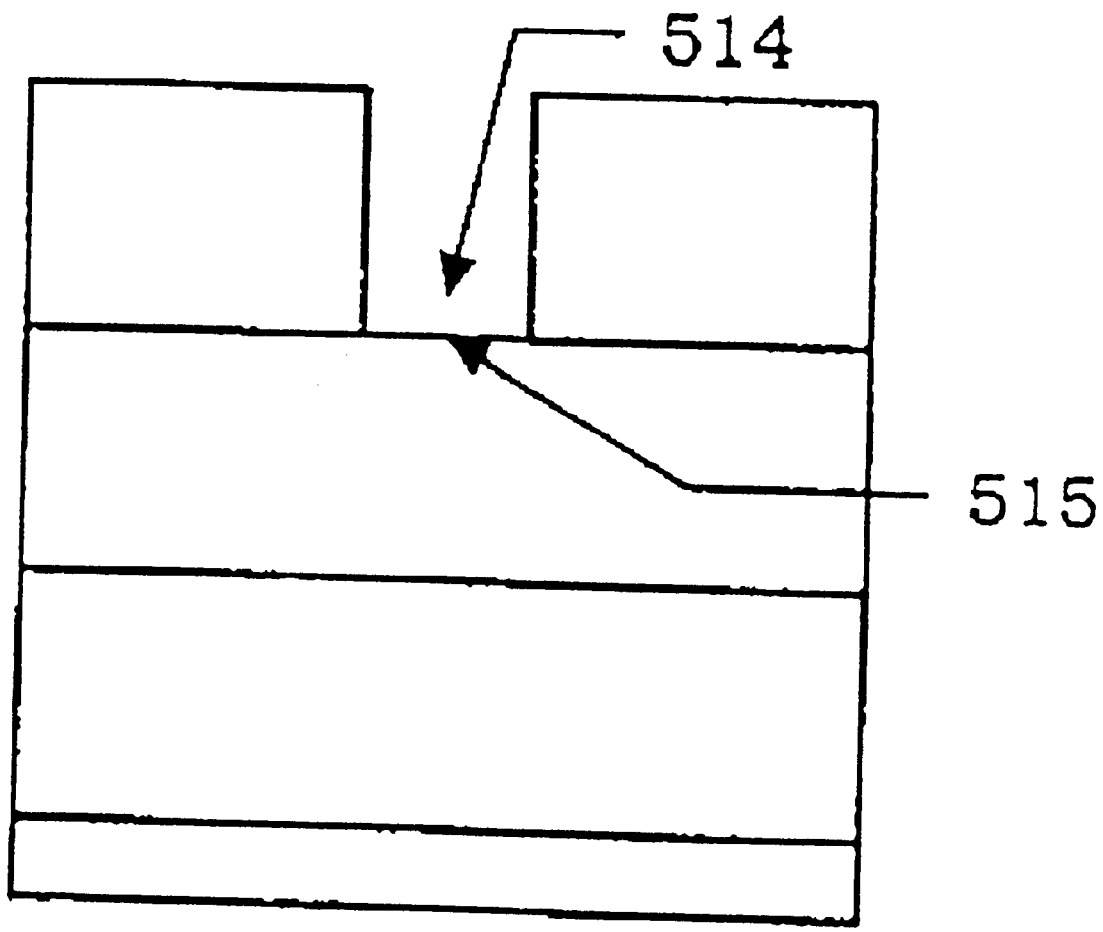

With reference to FIG. 7B, an opening pattern 514 is formed in the resist 513 so that a predetermined gate region 515 with a first bottom width of the insulating film 511 is shown through the opening pattern 514, whereby forming a photo-resist pattern 514 with the opening pattern 514.

Figure 7C:
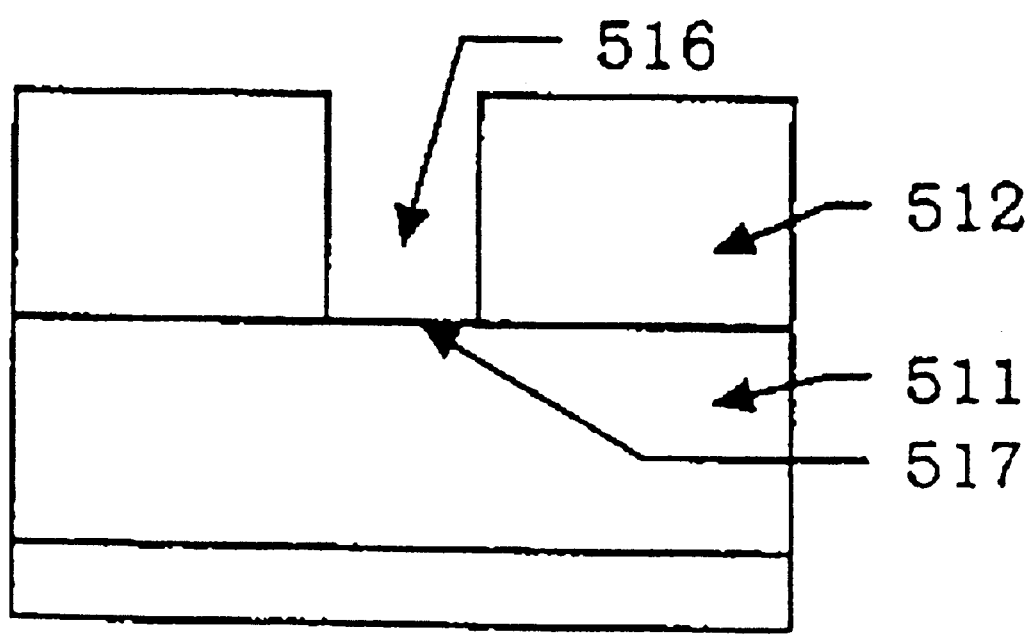

With reference to FIG. 7C, the resist pattern 513 is used for carrying out a first dry etching using $CF_6$ to the WSi film 512 to form an opening pattern 516 in the WSi film 512, wherein the opening pattern 516 has a second bottom width which is the same as the opening width and vertical side walls. The resist pattern 513 is removed by an oxygen plasma aching process and subsequent organic cleaning process.

Figure 7D:
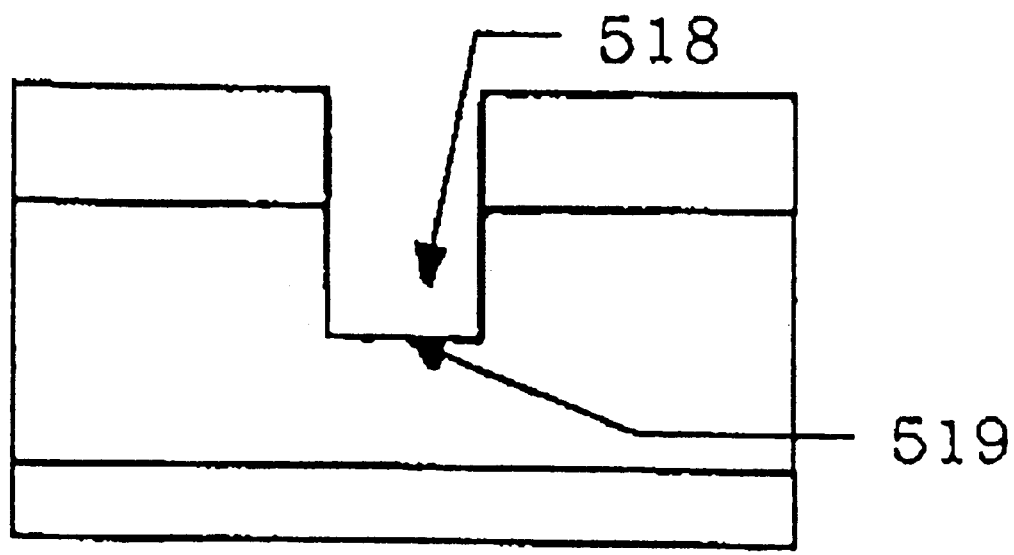

With reference to FIG. 7D, the WSi film 512 is used as a mask for carrying out a second dry etching, such as an ion reactive etching using $CF_4$, $C_2F_4$, or $CHF_3$, to the insulating film 511 at a selective etching ratio of less than 1 of the WSi film 512 to the insulating film 511 to form a first recessed pattern 518 in the insulating film 511, wherein the first recessed pattern 518 has a second bottom width and side walls which have a first oblique angle θ1 in the range of 75–90 degrees. The illustration is in the case of 90 degrees. The bottom 519 of the first recessed pattern 518 has a level from the interface between the substrate 510 and the insulating film 511, wherein the level is not larger than the double of the second bottom width. If the oblique angle θ is 90 degrees, then the second bottom width is equal to the first bottom width.

Figure 7E:
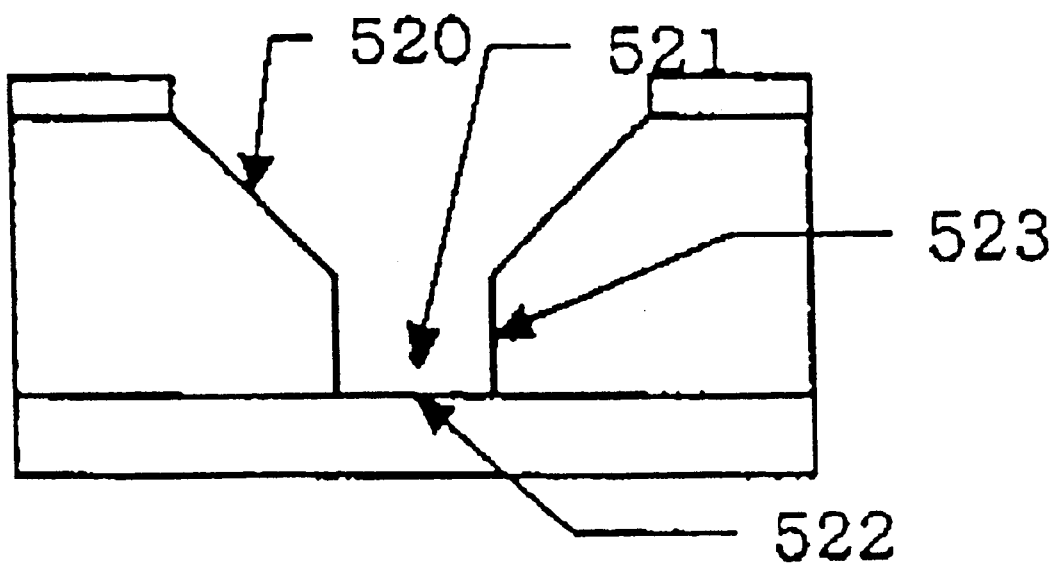

With reference to FIG. 7E, the WSi film 512 is again used for carrying out a third dry etching, such as an electron cyclotron resonance plasma enhanced etching using $SF_6$, to the insulating film 511 at a second selective etching ratio of more than 1 of the WSi film 512 to the insulating film 511 to form second and third recessed patterns 520 and 521 in the insulating film 511. The second recessed pattern 520 has sloped side walls which have an oblique angle θ2 in the range of 45–70 degrees. The third recessed pattern 521 is formed by etching down the bottom of the fist recessed pattern 518 so that a surface of the silicon substrate 510 is shown. The third recessed pattern 521 also has vertical side walls. A boundary between the sloped side wall of the second recessed pattern 520 and the vertical side wall of the third recessed pattern 521 has a level from the interface between the substrate 510 and the insulating film 511, wherein the level is not larger than the double of the second bottom width and more than zero. After the bottom of the third recessed pattern 521 has reached the surface of the substrate 510, the surface of the substrate is not etched whilst the etching direction is changed toward lateral direction so that an opening size of the third opening pattern 521 is enlarged in proportional to an excess etching amount after the bottom of the third recessed pattern 521 has just reached the surface of the substrate 510. The opening size of the third recessed pattern 521 is proportional to an over-etching ratio of excess etching amount to the etching amount to the remaining thickness 150 nanometers of the insulating film 511. If, for example, the bottom width of the first opening pattern 518 is 100 nanometers and the level of the bottom 519 of the first opening pattern 518 from the surface of the substrate 510 is 100 nanometers and the first oblique angle θ1 is 75 degrees, then the opening size of the third recessed pattern 521 is within 10% in dimensional variation ratio of the bottom width of the opening pattern 514 even the over-etching ratio is 20%. If the above first oblique angle θ1 is increased to 90 degrees, then the acceptable over-etching ratio for obtaining not more than 10% dimensional variation ratio is also increased from 20%. If, for example, the bottom width of the first opening pattern 518 is 150 nanometers and the level of the bottom 519 of the first opening pattern 518 from the surface of the substrate 510 is 100 nanometers and the first oblique angle θ1 is 75 degrees, then the opening size of the third recessed pattern 521 is within 10% in dimensional variation ratio of the bottom width of the opening pattern 514 even the over-etching ratio is 30%. If the above first oblique angle θ1 is increased to 90 degrees, then the acceptable over-etching ratio for obtaining not more than 10% dimensional variation ratio is also increased from 30%.

Namely, even if the over-etching ratio is 20%, then the opening size of the third recessed pattern 521 is within 10% in dimensional variation ratio of the bottom width of the opening pattern 514. The opening size of the third recessed pattern 521 finally defines the gate length. Particularly, when the bottom width of the opening pattern 514 of the photo-resist is within 0.4 micrometers, then the reduction in dimension or size of the opening pattern causes a delay in etching rate of the insulating film due to micro-loading effect. This makes it difficult to realize a high accurate control to the etching depth of the insulating film. The above novel method enlarges the acceptable over-etching ratio for obtaining not more than 10% dimensional variation ratio.

If an aspect ratio of the third recessed pattern 521 is not higher than 2, then it is possible to bury a metal layer within the third recessed pattern 521 without disconnection. Further if the aspect ratio of the third recessed pattern 521 is not higher than 1, then the yield of the gate electrode is increased.

Figure 8:
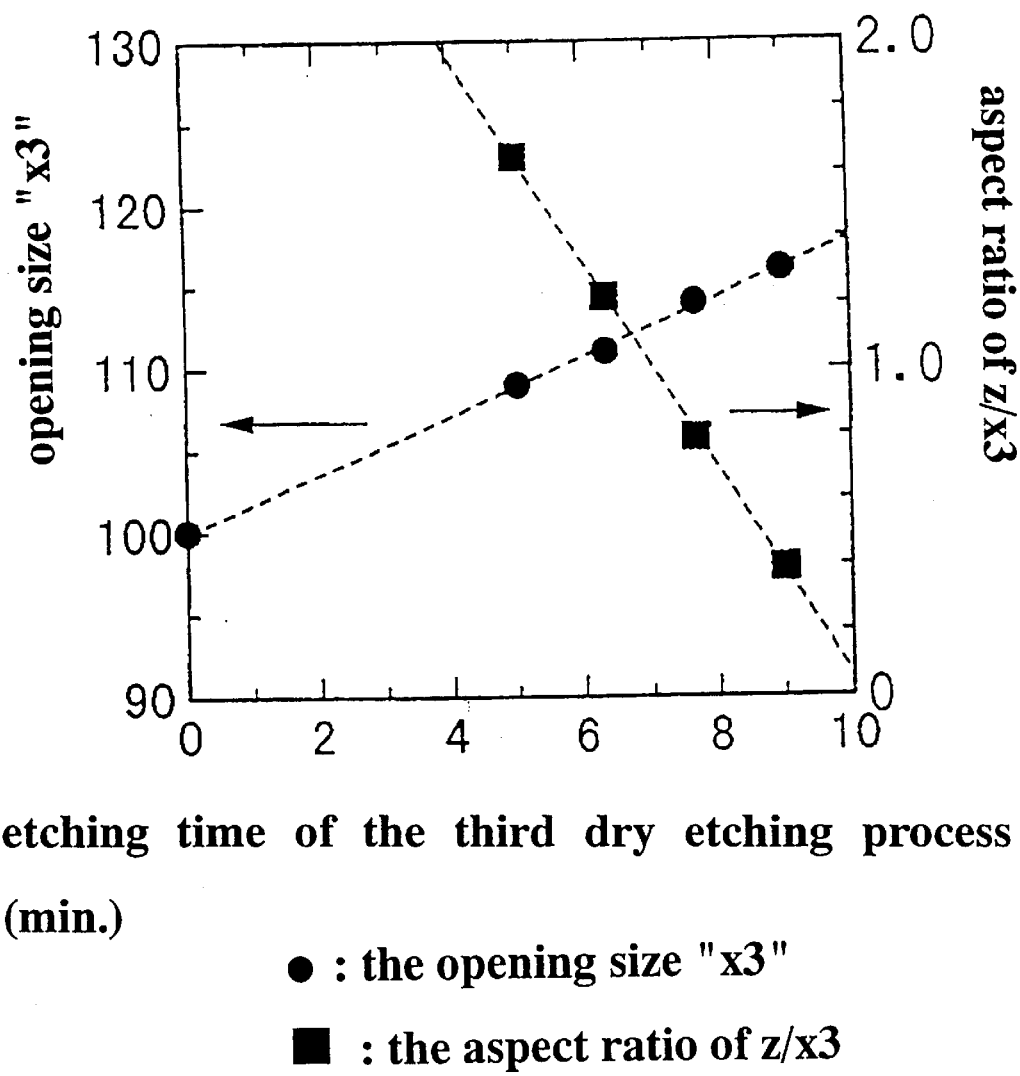
FIG. 8 is a diagram illustrative of variations in opening size of the third recessed pattern over the etching time of the third dry etching process and also illustrative of variations in aspect ratio of the third recessed pattern over the etching time of the second dry etching process, wherein ● represents the opening size whilst ■ represents the aspect ratio.

FIG. 8 is a diagram illustrative of variations in opening size of the third recessed pattern over the etching time of the third dry etching process and also illustrative of variations in aspect ratio of the third recessed pattern over the etching time of the second dry etching process, wherein ● represents the opening size whilst ■ represents the aspect ratio.

Figure 7F:
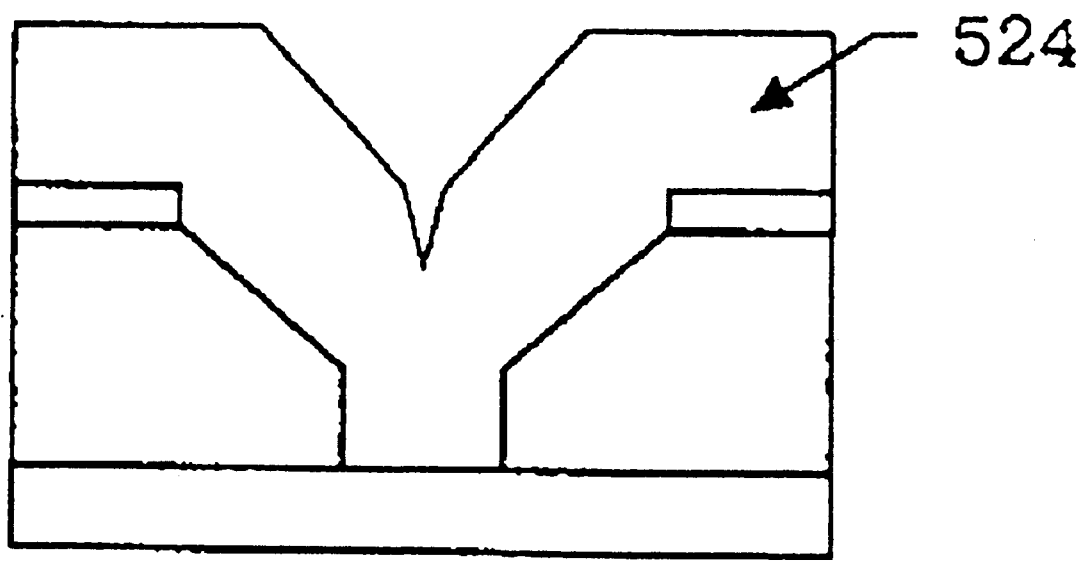

With reference to FIG. 7F, a WSi/Au gate metal film 524 is deposited by a sputtering method to bury the second and third opening patterns 520 and 521.

Figure 7G:
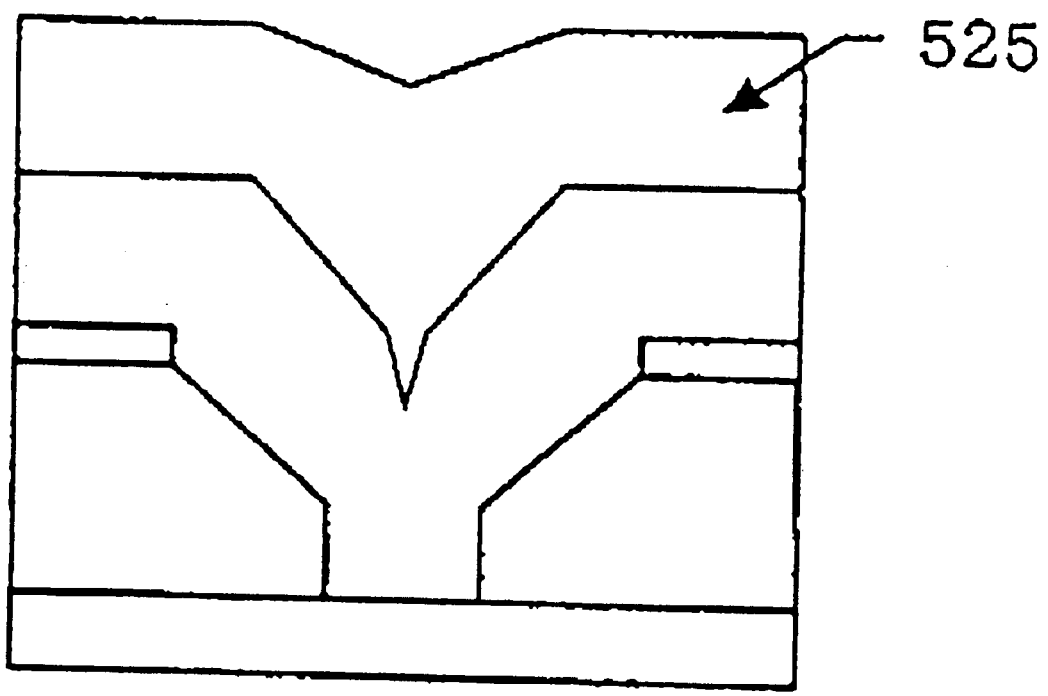

With reference to FIG. 7G, a second photo-resist 525 having a thickness of 1 micrometer for i-ray exposure is applied on the gate metal film 524.

Figure 7H:
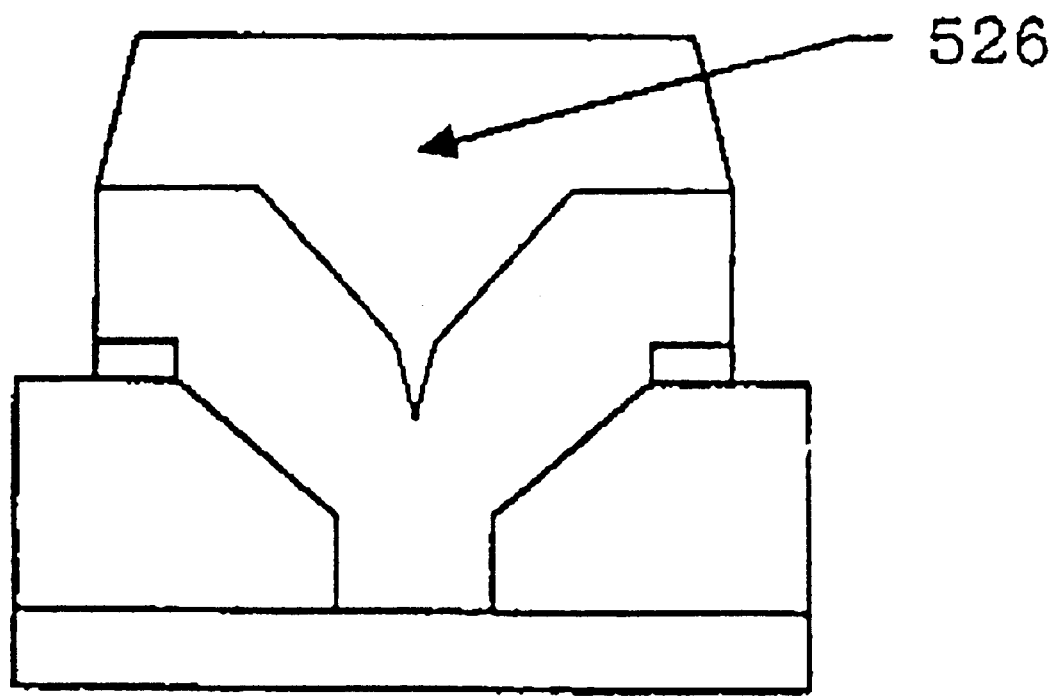

With reference to FIG. 7H, the second photo-resist 525 is patterned to form a negative-type photo-resist pattern 526 with a 800 nanometers dimension or size. The negative type photo-resist pattern 526 is used for selectively etching the gate metal film 524 with a reactive ion etching or an ion milling process to form a Schottky gate electrode 527.

Figure 7I:
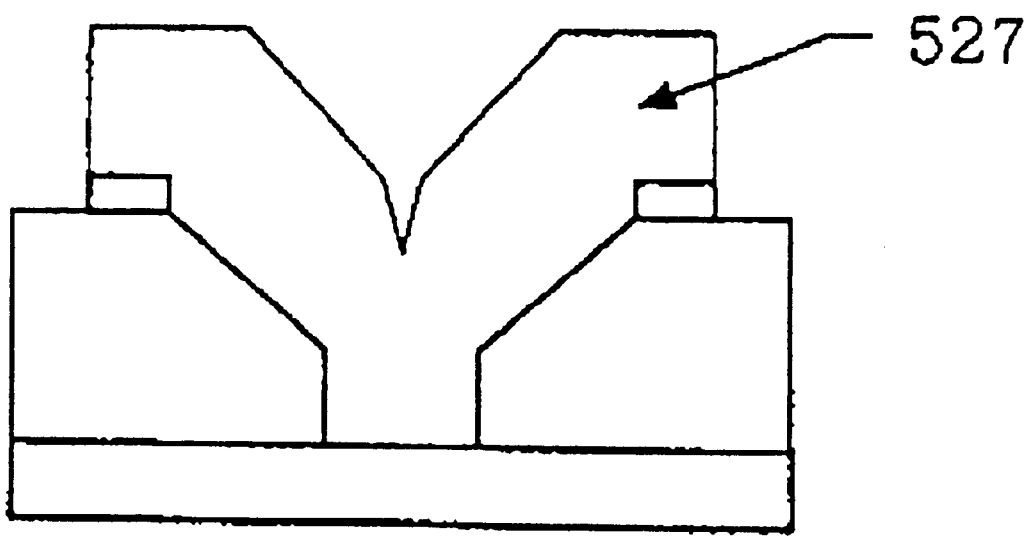

With reference to FIG. 7I, the used negative-type photo-resist pattern 526 is then removed by an oxygen plasma aching process and subsequent organic cleaning process.

As a modification to the above third embodiment, in place of the silicon dioxide insulating film 511, a silicon nitride insulating film or a silicon oxide and nitride film is also available.

As an additional modification to the above third embodiment, in place of the WSi/Au gate metal film 524, a WSiN film or a W film is also available.

As a further modification to the above third embodiment, in place of the electron beam exposure etching mask 513, an i-ray exposure etching mask is also available to form 400 nanometers opening 513.

As a further more modification to the above third embodiment, in place of the electron beam exposure etching mask 513, a KrF laser beam exposure etching mask is also available to form 200 nanometers opening 513.

As a still further modification to the above third embodiment, in place of the reactive ion etching process for forming the first opening pattern 518, a magnetron reactive ion etching process, an electron cyclotron resonance plasma enhanced etching process or an inductive coupled plasma enhanced etching process is also available.

As yet further modification to the above third embodiment, in place of the electron cyclotron resonance plasma enhanced etching process for forming the second opening pattern 520, a magnetron reactive ion etching process, a reactive ion etching process or an inductive coupled plasma enhanced etching process is also available.

As moreover modification to the above third embodiment, in place of the i-ray exposure etching mask 525, a g-ray exposure etching mask or an electron beam exposure etching mask is also available.

FOURTH EMBODIMENT

A fourth embodiment according to the present invention will be described in detail with reference to FIGS. 9A through 9I which are fragmentary cross sectional elevation views illustrative of a first novel method of forming a fine and low resistive gate electrode of a field effect transistor in a fourth embodiment in accordance with the present invention.

Figure 9A:
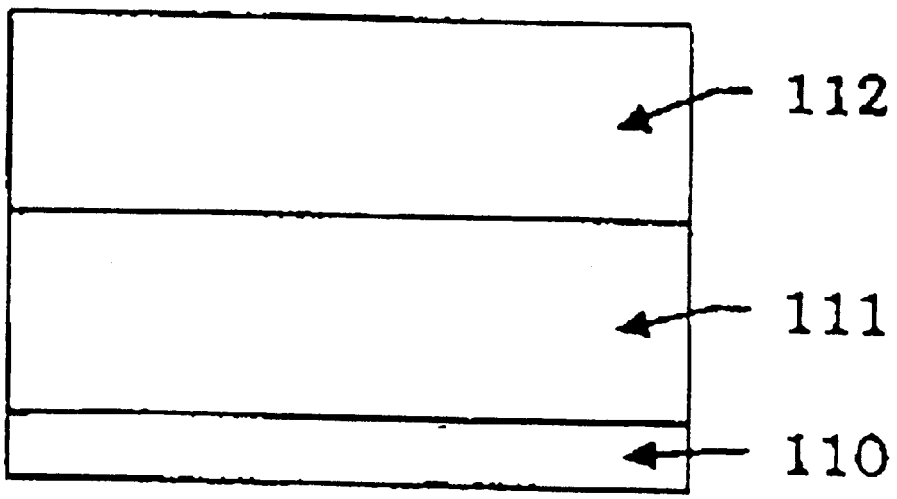
FIGS. 9A through 9I are fragmentary cross sectional elevation views illustrative of a first novel method of forming a fine and low resistive gate electrode of a field effect transistor in a fourth embodiment in accordance with the present invention.

With reference to FIG. 9A, an insulating film 111 having a thickness of 300 nanometers is formed on a semiconductor substrate 110. A photo-resist 112 having a thickness of 100 nanometers for electron beam is formed on the insulating film 111.

Figure 9B:
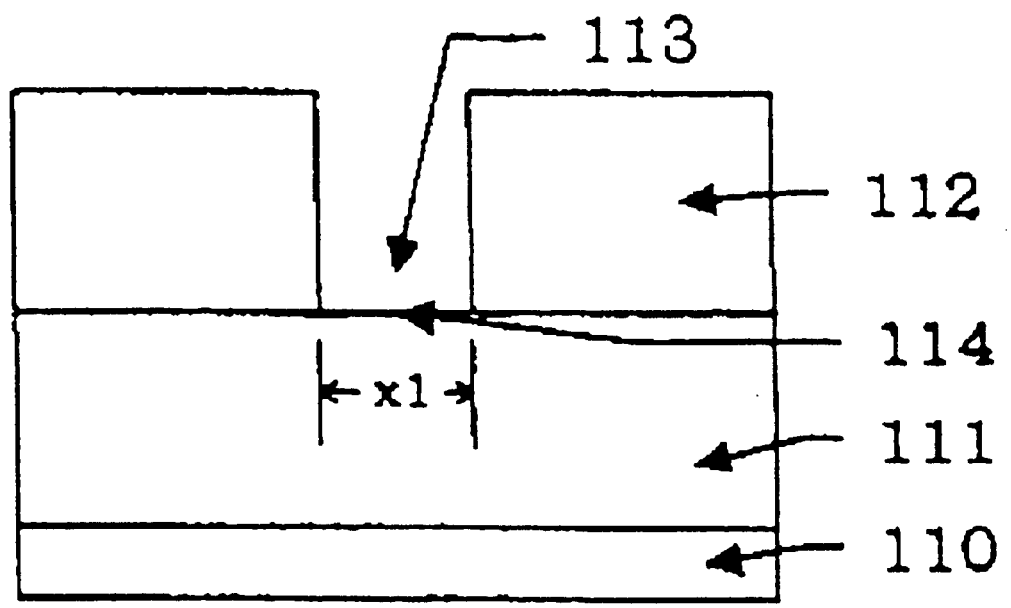

With reference to FIG. 9B, an opening pattern 113 is formed in the photo-resist 112 so that a predetermined gate region 114 with a first bottom width of "X1" of the insulating film 111 is shown through the opening pattern 113, whereby forming a photo-resist pattern 112 with the opening pattern 113.

Figure 9C:
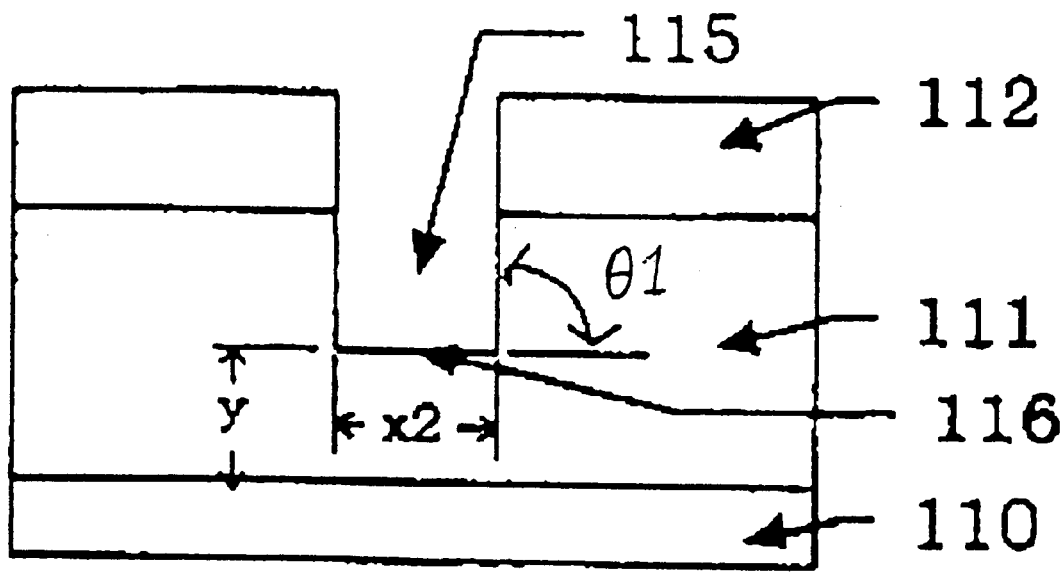

With reference to FIG. 9C, the photo-resist pattern 112 is used for carrying out a first dry etching, such as an ion reactive etching using $CF_4$, $C_2F_4$, or $CHF_3$, to the insulating film 111 at a selective etching ratio of less than 1 of the photo-resist pattern 112 to the insulating film 111 to form a first recessed pattern 115 in the insulating film 111, wherein the first recessed pattern 115 has a second bottom width of "X2" and side walls which have an oblique angle $\theta 1$ in the range of 75–90 degrees. The illustration is in the case of 90 degrees. The bottom of the first recessed pattern 115 has a level "y" from the interface between the substrate 110 and the insulating film 111, wherein the level "y" is not larger than the double of the second bottom width of "X2". If the oblique angle $\theta$ is 90 degrees, then the second bottom width of "X2" is equal to the first bottom width of "X1".

Figure 9D:
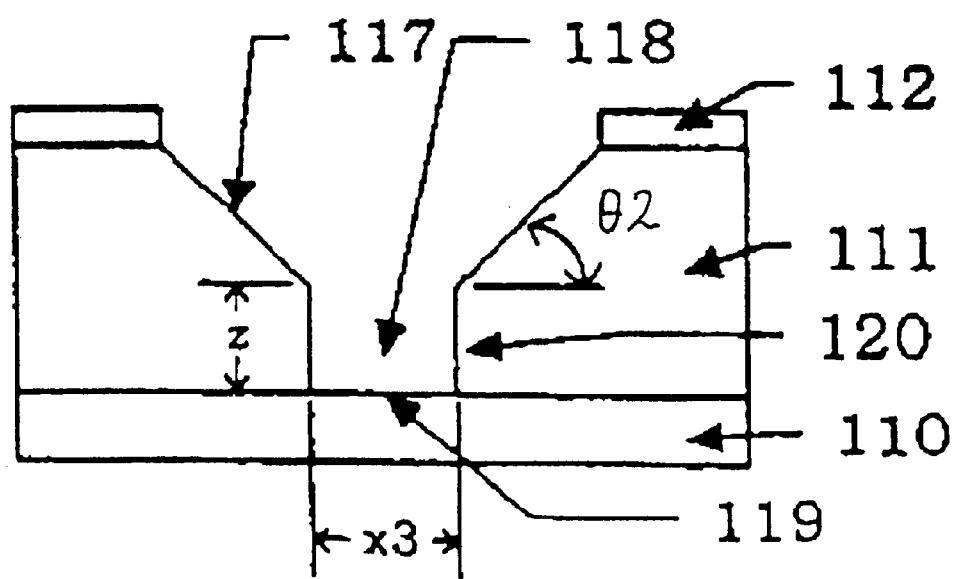

With reference to FIG. 9D, the photo-resist pattern 112 is again used for carrying out a second dry etching, such as an electron cyclotron resonance plasma enhanced etching using $SF_6$, to the insulating film 111 at a second selective etching ratio of more than 1 of the photo-resist pattern 112 to the insulating film 111 to form second and third recessed patterns 117 and 118 in the insulating film 111. The second recessed pattern 117 has sloped side walls which have an oblique angle $\theta 2$ in the range of 45–70 degrees. The third recessed pattern 118 is formed by etching down the bottom of the first recessed pattern 115 so that a surface of the silicon substrate 110 is shown. The third recessed pattern 118 also has vertical side walls. A boundary between the sloped side wall of the second recessed pattern 117 and the vertical side wall of the third recessed pattern 118 has a level "z" from the interface between the substrate 110 and the insulating film 111, wherein the level "z" is not larger than the double of the second bottom width of "X2" and more than zero. After the bottom of the third recessed pattern 118 has reached the surface of the substrate 110, the surface of the substrate is not etched whilst the etching direction is changed toward lateral direction so that an opening size "x3" of the third opening pattern 118 is enlarged in proportional to an excess etching amount after the bottom of the third recessed pattern 118 has just reached the surface of the substrate 110. The opening size "x3" of the third recessed pattern 118 is proportional to an over-etching ratio of excess etching amount to the etching amount to the remaining thickness 150 nanometers of the insulating film 111. If, for example, the bottom width "X2" of the first opening pattern 115 is 100 nanometers and the level "y" of the bottom 116 of the first opening pattern 115 from the surface of the substrate 110 is 100 nanometers and the first oblique angle $\theta 1$ is 75 degrees, then the opening size "x3" of the third recessed pattern 118 is within 10% in dimensional variation ratio of the bottom width of "X1" of the opening pattern 113 even the over-etching ratio is 20%, wherein the dimensional variation ratio is defined to be (x3−x1)/x1. If the above first oblique angle $\theta 1$ is increased to 90 degrees, then the acceptable over-etching ratio for obtaining not more than 10% dimensional variation ratio is also increased from 20%. If, for example, the bottom width "X2" of the first opening pattern 115 is 150 nanometers and the level "y" of the bottom 116 of the first opening pattern 115 from the surface of the substrate 110 is 100 nanometers and the first oblique angle $\theta 1$ is 75 degrees, then the opening size "x3" of the third recessed pattern 118 is within 10% in dimensional variation ratio of the bottom width of "X1" of the opening pattern 113 even the over-etching ratio is 30%, wherein the dimensional variation ratio is defined to be (x3−x1)/x1. If the above first oblique angle $\theta 1$ is increased to 90 degrees, then the acceptable over-etching ratio for obtaining not more than 10% dimensional variation ratio is also increased from 30%.

Namely, even if the over-etching ratio is 20%, then the opening size "x3" of the third recessed pattern 118 is within 10% in dimensional variation ratio of the bottom width of "X1" of the opening pattern 113. The opening size "x3" of the third recessed pattern 118 finally defines the gate length. Particularly, when the bottom width of "X1" of the opening pattern 113 of the photo-resist is within 0.4 micrometers, then the reduction in dimension or size of the opening pattern causes a delay in etching rate of the insulating film due to microloading effect. This makes it difficult to realize a high accurate control to the etching depth of the insulating film. The above novel method enlarges the acceptable over-etching ratio for obtaining not more than 10% dimensional variation ratio.

If an aspect ratio of z/x3 of the third recessed pattern 118 is not higher than 2, then it is possible to bury a metal layer within the third recessed pattern 118 without disconnection. Further if the aspect ratio of z/x3 of the third recessed pattern 118 is not higher than 1, then the yield of the gate electrode is increased.

Figure 9E:
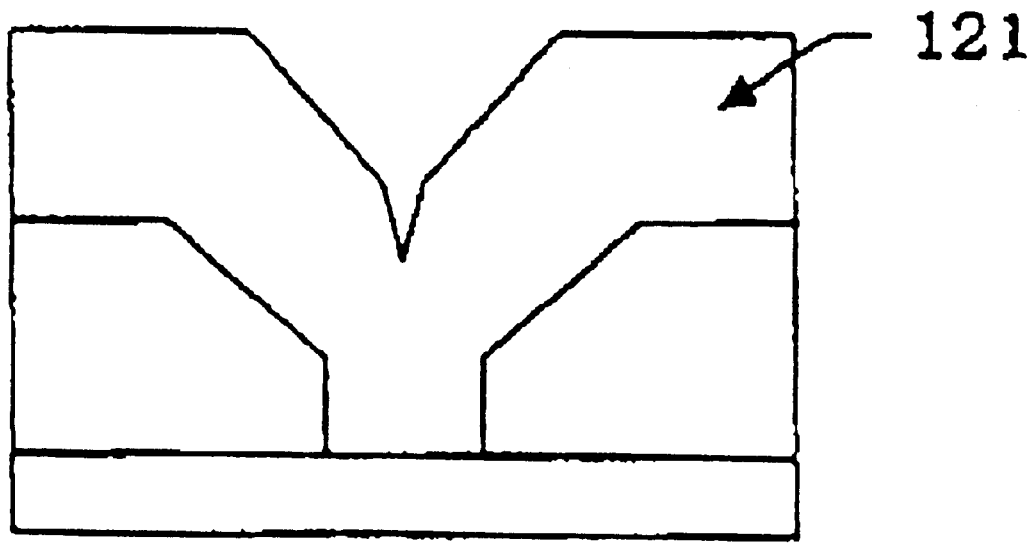

With reference to FIG. 9E, the positive-type photo-resist 112 is removed by an oxygen plasma aching process and subsequent organic cleaning process from the insulating film 111. A WSi/Au gate metal film 121 is deposited by a sputtering method to bury the second and third opening patterns 117 and 118.

Figure 9F:
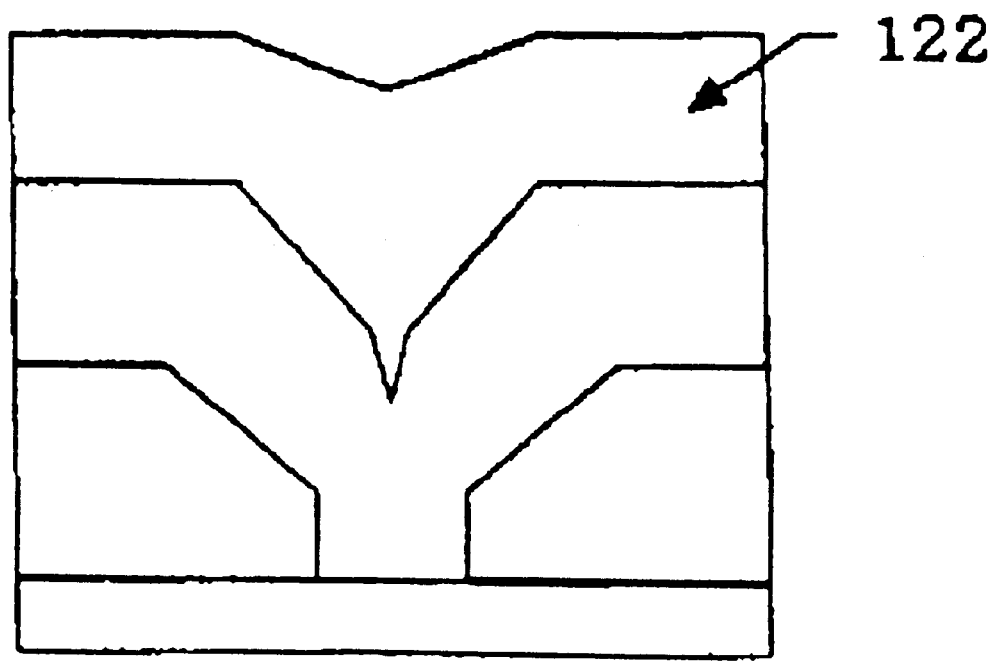

With reference to FIG. 9F, a second photo-resist 122 having a thickness of 1 micrometer for i-ray exposure is applied on the gate metal film 121.

Figure 9G:
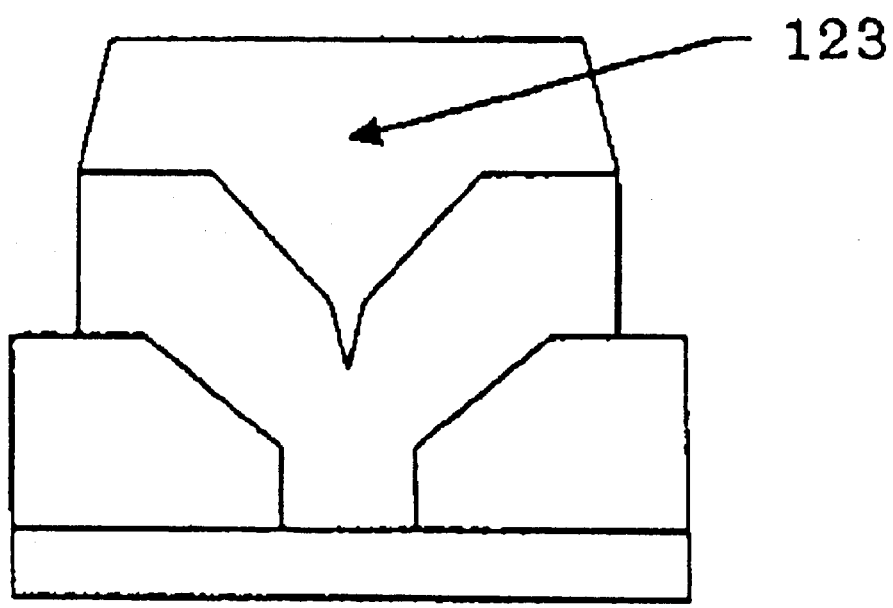

With reference to FIG. 9G, the second photo-resist 122 is patterned to form a negative-type photo-resist pattern 123 with a 800 nanometers dimension or size. The negative-type photo-resist pattern 123 is used for selectively etching the gate metal film 121 with a reactive ion etching or an ion milling process to form a Schottky gate electrode 124.

Figure 9H:
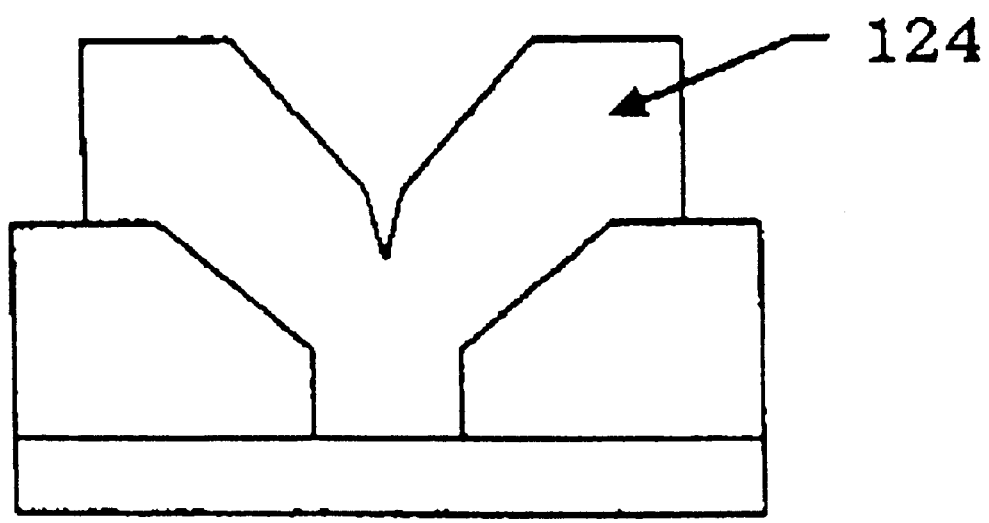

With reference to FIG. 9H, the used negative-type photo-resist pattern 123 is then removed by an oxygen plasma etching process and subsequent organic cleaning process.

Figure 9I:
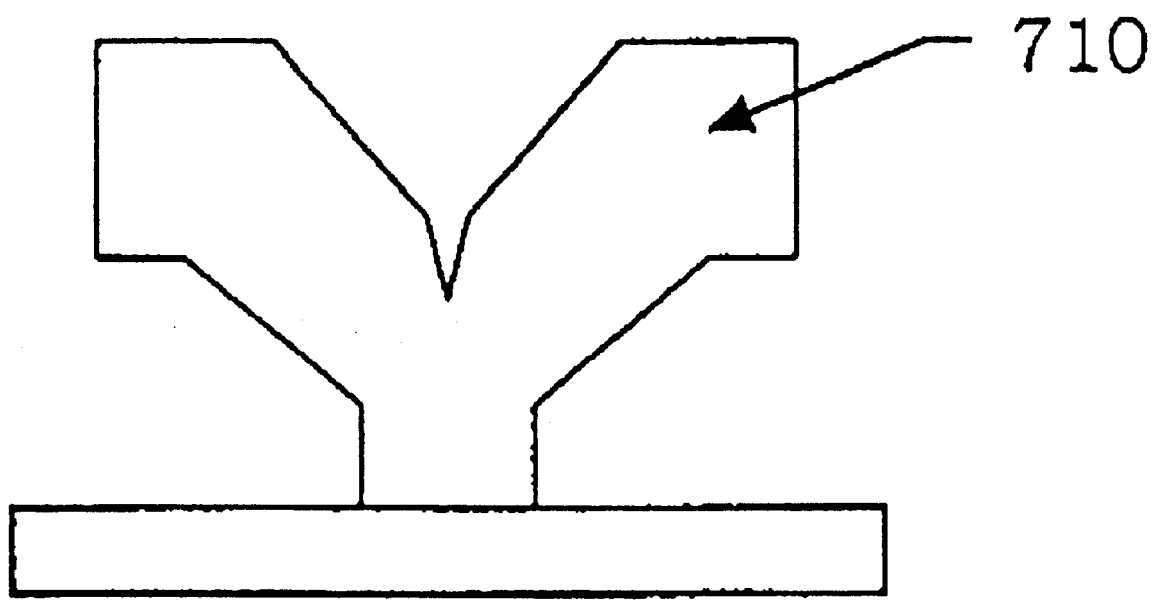

With reference to FIG. 9I, further the insulating film 111 may optionally be removed by to form the Schottky gate electrode 710 which has a reduced parasitic capacitance and improved high speed performances such as high cut-off and maximum cut-off frequencies.

As a modification to the above fourth embodiment, in place of the silicon dioxide insulating film 111, a silicon nitride insulating film or a silicon oxide and nitride film is also available.

As a further modification to the above fourth embodiment, in place of the electron beam exposure etching mask 112, an i-ray exposure etching mask is also available to form 400 nanometers opening 113.

As a further more modification to the above fourth embodiment, in place of the electron beam exposure etching mask 112, a KrF laser beam exposure etching mask is also available to form 200 nanometers opening 113.

As a still further modification to the above fourth embodiment, in place of the reactive ion etching process for forming the first opening pattern 115, a magnetron reactive ion etching process, an electron cyclotron resonance plasma enhanced etching process or an inductive coupled plasma enhanced etching process is also available.

As yet further modification to the above fourth embodiment, in place of the electron cyclotron resonance plasma enhanced etching process for forming the second opening pattern 117, a magnetron reactive ion etching process, a reactive ion etching process or an inductive coupled plasma enhanced etching process is also available.

As moreover modification to the above fourth embodiment, in place of the i-ray exposure etching mask 122, a g-ray exposure etching mask or an electron beam exposure etching mask is also available.

FIFTH EMBODIMENT

A fifth embodiment according to the present invention will be described in detail with reference to FIGS. 10A through 10J which are fragmentary cross sectional elevation views illustrative of a first novel method of forming a fine and low resistive gate electrode of a field effect transistor in a third embodiment in accordance with the present invention.

Figure 10A:
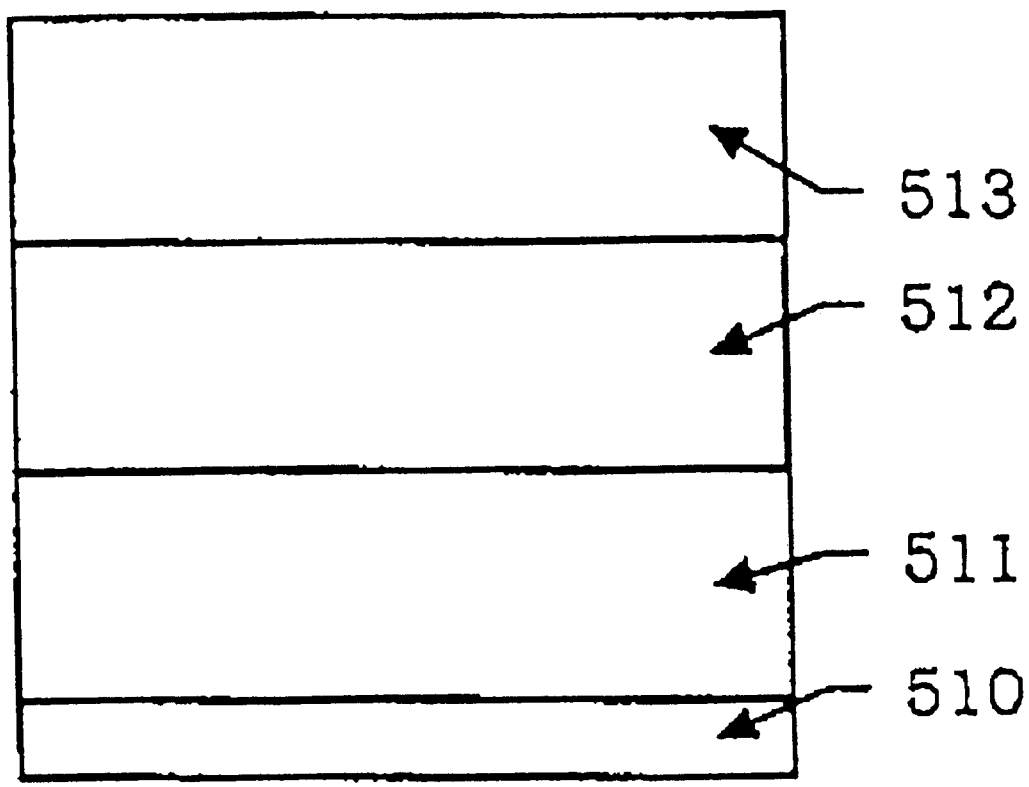
FIGS. 10A through 10J are fragmentary cross sectional elevation views illustrative of a first novel method of forming a fine and low resistive gate electrode of a field effect transistor in a fifth embodiment in accordance with the present invention.

With reference to FIG. 10A, an insulating film 511 having a thickness of 300 nanometers is formed on a semiconductor substrate 510. A WSi film 512 having a thickness of 300 nanometers is deposited on the insulating film 511 by a sputtering method. A electron beam exposure-resist 513 having a thickness of 300 nanometers for electron beam is formed on the WSi film 512.

Figure 10B:
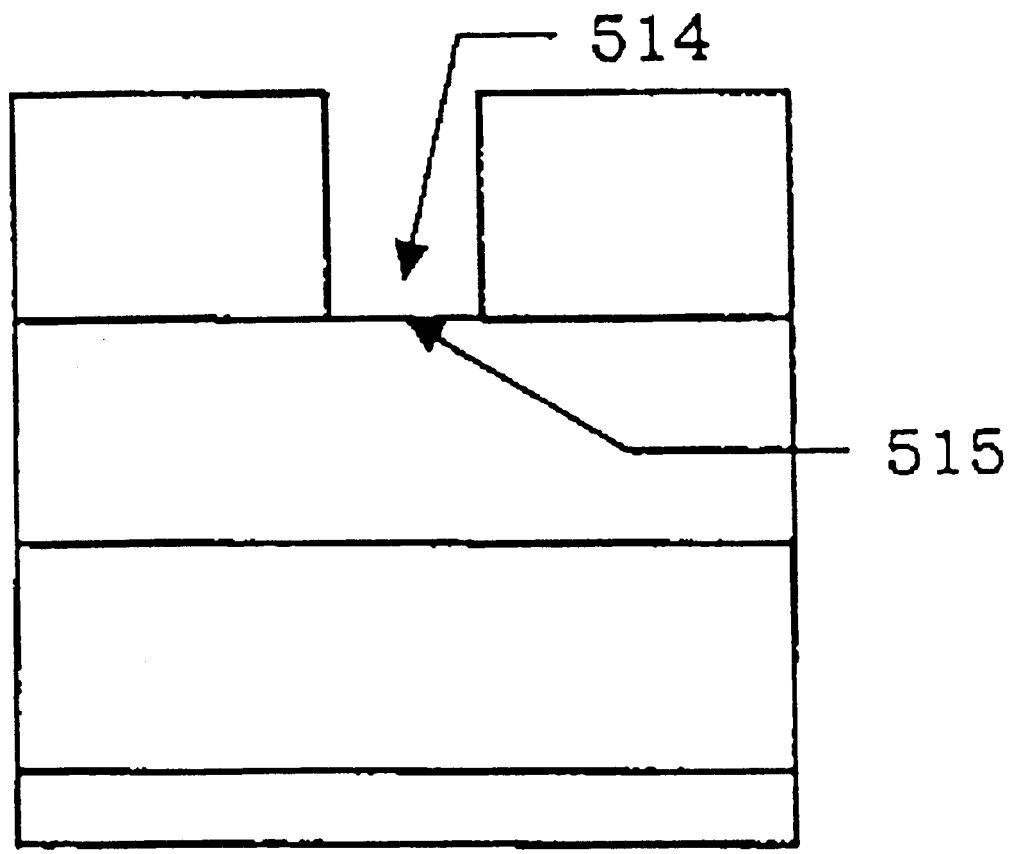

With reference to FIG. 10B, an opening pattern 514 is formed in the resist 513 so that a predetermined gate region 515 with a first bottom width of the insulating film 511 is shown through the opening pattern 514, whereby forming a photo-resist pattern 514 with the opening pattern 514.

Figure 10C:
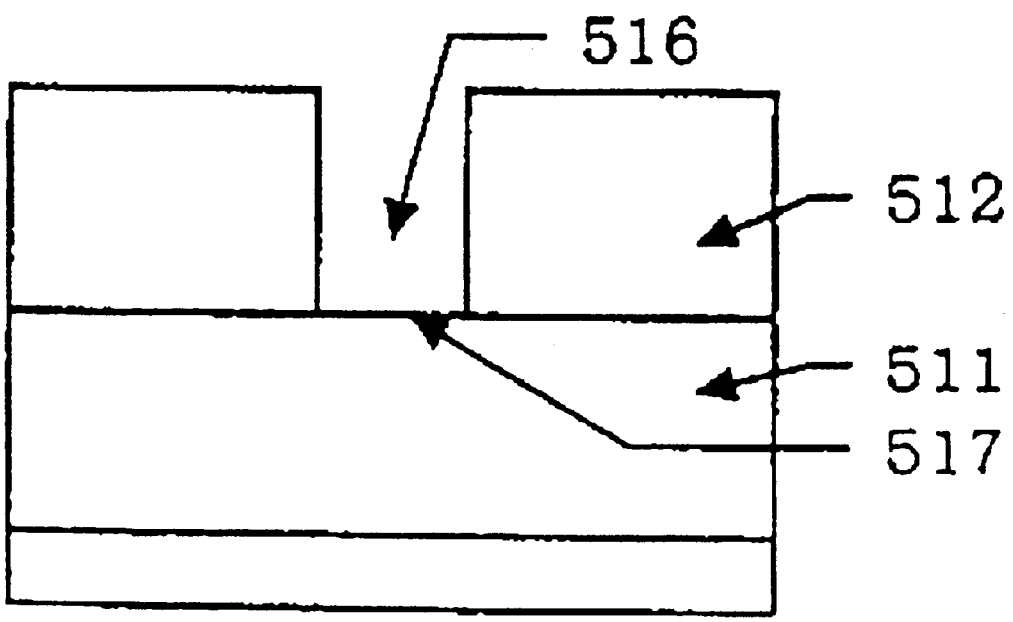

With reference to FIG. 10C, the resist pattern 513 is used for carrying out a first dry etching using $CF_6$ to the WSi film 512 to form an opening pattern 516 in the WSi film 512, wherein the opening pattern 516 has a second bottom width which is the same as the opening width and vertical side walls. The resist pattern 513 is removed by an oxygen plasma aching process and subsequent organic cleaning process.

Figure 10D:
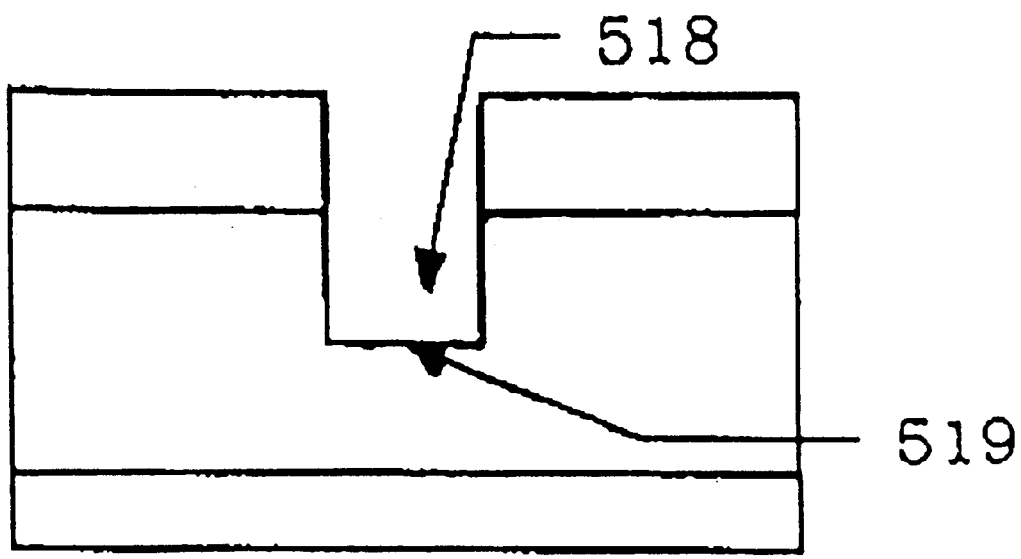

With reference to FIG. 10D, the WSi film 512 is used as a mask for carrying out a second dry etching, such as an ion reactive etching using $CF_4$, $C_2F_4$, or $CHF_3$, to the insulating film 511 at a selective etching ratio of less than 1 of the WSi film 512 to the insulating film 511 to form a first recessed pattern 518 in the insulating film 511, wherein the first recessed pattern 118 has a second bottom width and side walls which have a first oblique angle θ1 in the range of 75–90 degrees. The illustration is in the case of 90 degrees. The bottom 519 of the first recessed pattern 518 has a level from the interface between the substrate 510 and the insulating film 511, wherein the level is not larger than the double of the second bottom width. If the oblique angle θ is 90 degrees, then the second bottom width is equal to the first bottom width.

Figure 10E:
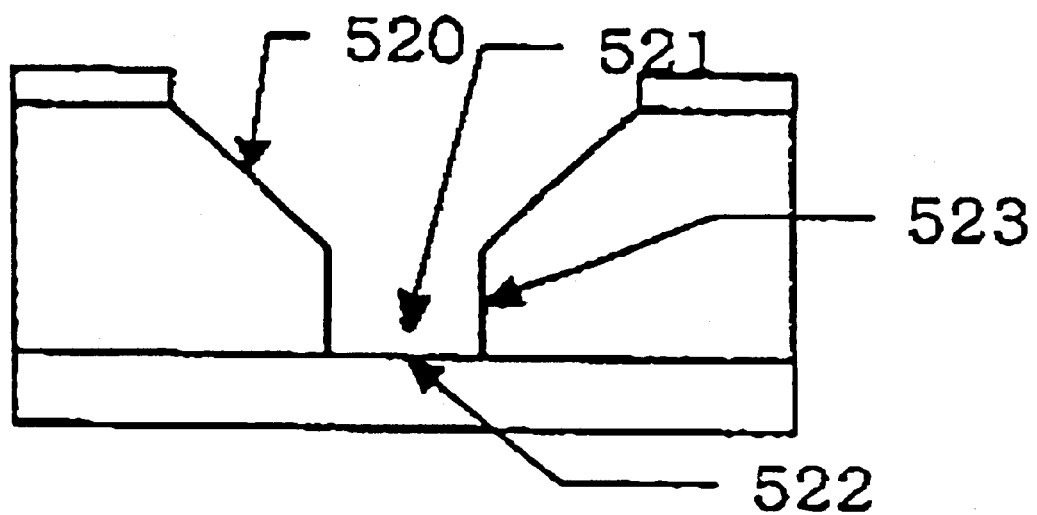

With reference to FIG. 10E, the WSi film 512 is again used for carrying out a third dry etching, such as an electron cyclotron resonance plasma enhanced etching using $SF_6$, to the insulating film 511 at a second selective etching ratio of more than 1 of the WSi film 512 to the insulating film 511 to form second and third recessed patterns 520 and 521 in the insulating film 511. The second recessed pattern 520 has sloped side walls which have an oblique angle θ2 in the range of 45–70 degrees. The third recessed pattern 521 is formed by etching down the bottom of the first recessed pattern 518 so that a surface of the silicon substrate 510 is shown. The third recessed pattern 521 also has vertical side walls. A boundary between the sloped side wall of the second recessed pattern 520 and the vertical side wall of the third recessed pattern 521 has a level from the interface between the substrate 510 and the insulating film 511, wherein the level is not larger than the double of the second bottom width and more than zero. After the bottom of the third recessed pattern 521 has reached the surface of the substrate 510, the surface of the substrate is not etched whilst the etching direction is changed toward lateral direction so that an opening size of the third opening pattern 521 is enlarged in proportional to an excess etching amount after the bottom of the third recessed patter 521 has just reached the surface of the substrate 510. The opening size of the third recessed pattern 521 is proportional to an over-etching ratio of excess etching amount to the etching amount to the remaining thickness 150 nanometers of the insulating film 511. If, for example, the bottom width of the first opening pattern 518 is 100 nanometers and the level of the bottom 519 of the first opening pattern 518 from the surface of the substrate 510 is 100 nanometers and the first oblique angle θ1 is 75 degrees, then the opening size of the third recessed pattern 521 is within 10% in dimensional variation ratio of the bottom width of the opening pattern 514 even the over-etching ratio is 20%. If the above first oblique angle θ1 is increased to 90 degrees, then the acceptable over-etching ratio for obtaining not more than 10% dimensional variation ratio is also increased from 20%. If, for example, the bottom width of the first opening pattern 518 is 150 nanometers and the level of the bottom 519 of the first opening pattern 518 from the surface of the substrate 510 is 100 nanometers and the first oblique angle θ1 is 75 degrees, then the opening size of the third recessed pattern 521 is within 10% in dimensional variation ratio of the bottom width of the opening pattern 5143 even the over-etching ratio is 30%. If the above first oblique angle θ1 is increased to 90 degrees, then the acceptable over-etching ratio for obtaining not more than 10% dimensional variation ratio is also increased from 30%.

Namely, even if the over-etching ratio is 20%, then the opening size of the third recessed pattern 521 is within 10% in dimensional variation ratio of the bottom width of the opening pattern 5143. The opening size of the third recessed pattern 521 finally defines the gate length. Particularly, when the bottom width of the opening pattern 514 of the photo-resist is within 0.4 micrometers, then the reduction in dimension or size of the opening pattern causes a delay in etching rate of the insulating film due to micro-loading effect. This makes it difficult to realize a high accurate control to the etching depth of the insulating film. The above novel method enlarges the acceptable over-etching ratio for obtaining not more than 10% dimensional variation ratio.

If an aspect ratio of the third recessed pattern 521 is not higher than 2, then it is possible to bury a metal layer within the third recessed pattern 521 without disconnection. Further if the aspect ratio of the third recessed pattern 521 is not higher than 1, then the yield of the gate electrode is increased.

FIG. 8 is a diagram illustrative of variations in opening size of the third recessed pattern over the etching time of the third dry etching process and also illustrative of variations in aspect ratio of the third recessed pattern over the etching time of the second dry etching process, wherein ● represents the opening size whilst ■ represents the aspect ratio.

Figure 10F:
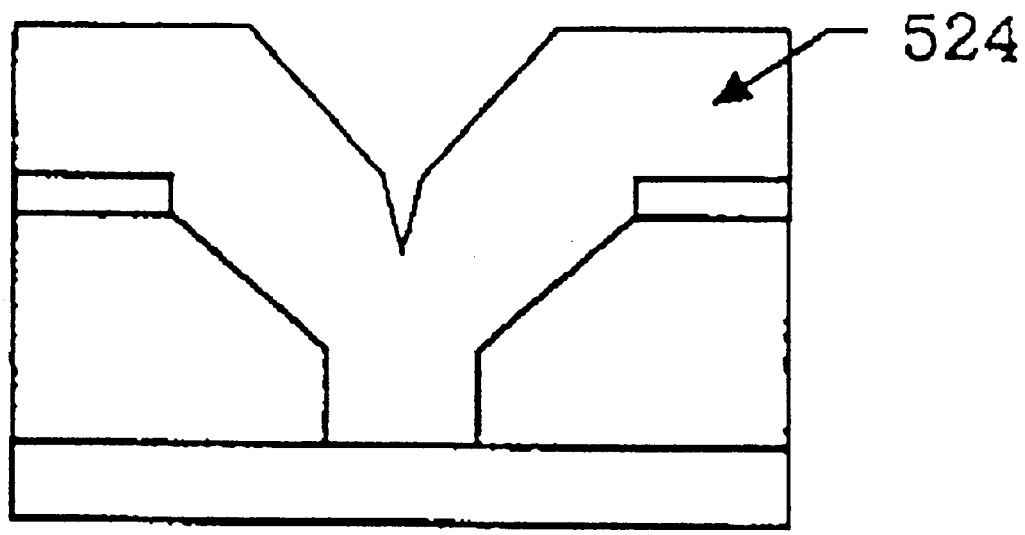

With reference to FIG. 10F, a WSi/Au gate metal film 524 is deposited by a sputtering method to bury the second and third opening patterns 520 and 521.

Figure 10G:
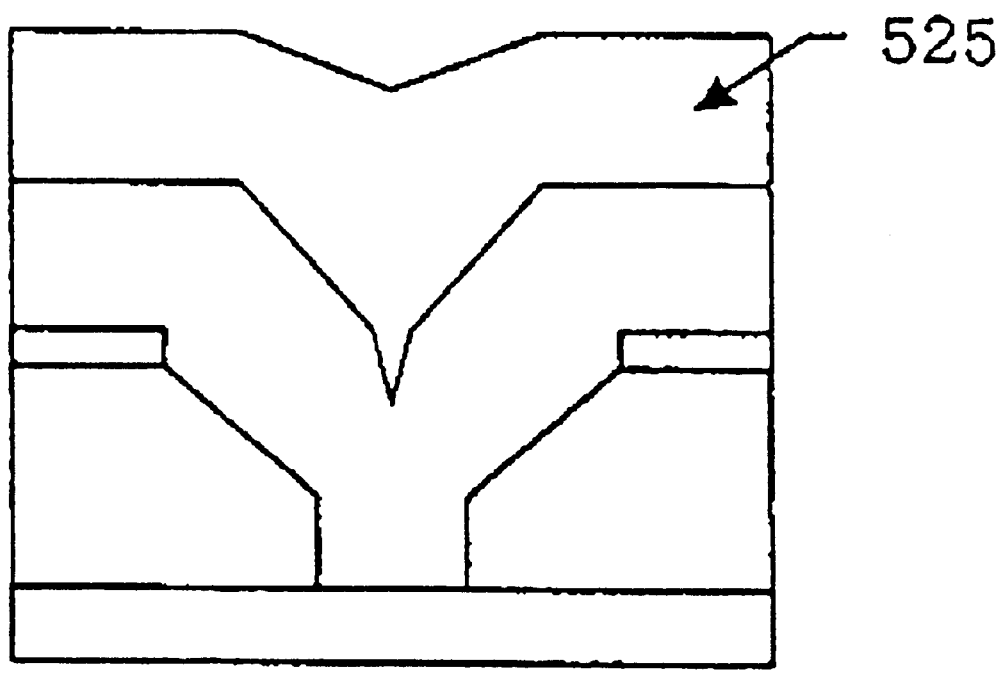

With reference to FIG. 10G, a second photo-resist 525 having a thickness of 1 micrometer for i-ray exposure is applied on the gate metal film 524.

Figure 10H:
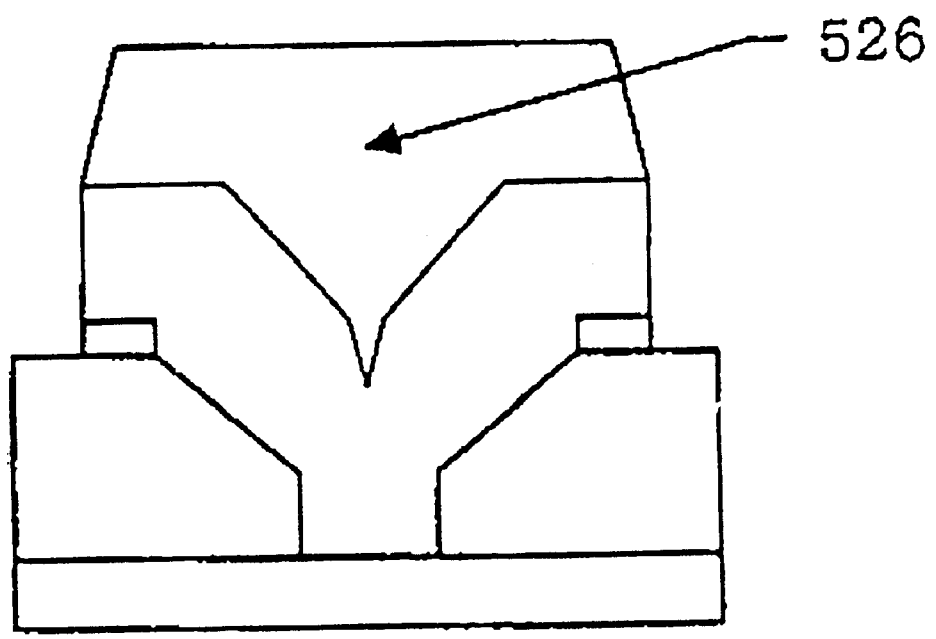

With reference to FIG. 10H, the second photo-resist 525 is patterned to form a negative-type photo-resist pattern 526 with a 800 nanometers dimension or size. The negative-type photo-resist pattern 526 is used for selectively etching the gate metal film 524 with a reactive ion etching or an ion milling process to form a Schottky gate electrode 527.

Figure 10I:
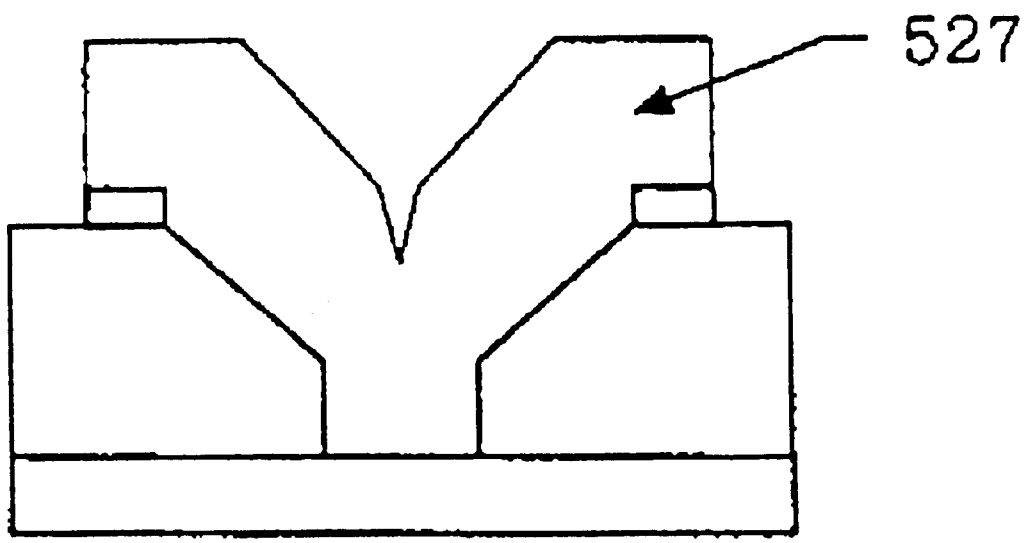

With reference to FIG. 10I, the used negative-type photo-resist pattern 526 is then removed by an oxygen plasma aching process and subsequent organic cleaning process.

Figure 10J:
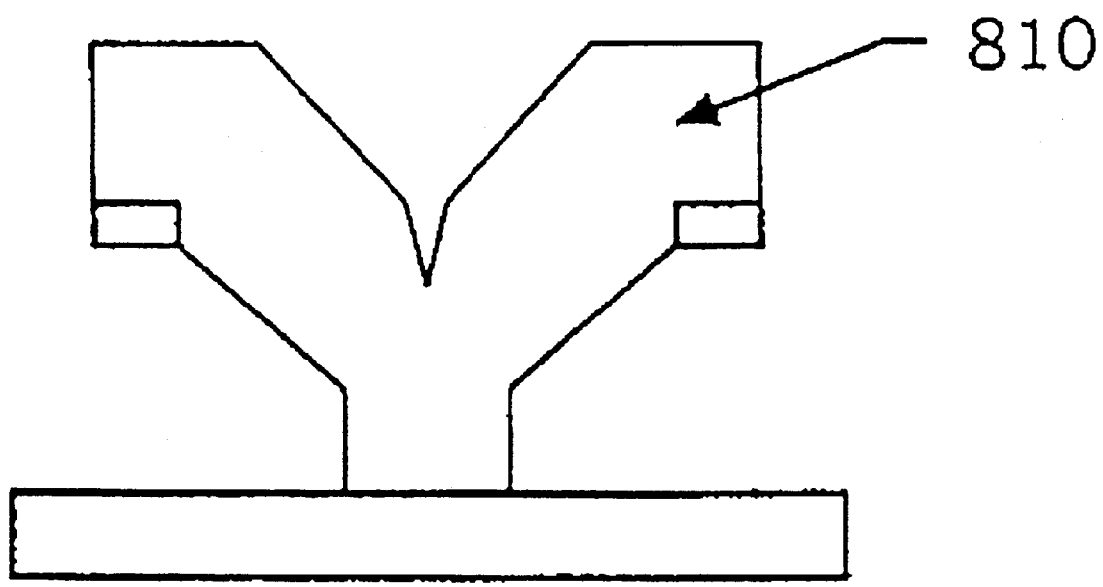

With reference to FIG. 10J, further the insulating film 511 may optionally be removed by to form the Schottky gate electrode 810 which has a reduced parasitic capacitance and improved high speed performances such as high cut-off and maximum cut-off frequencies.

As a modification to the above third embodiment, in place of the silicon dioxide insulating film 511, a silicon nitride insulating film or a silicon oxide and nitride film is also available.

As an additional modification to the above third embodiment, in place of the WSi/Au gate metal film 524, a WSiN film or a W film is also available.

As a further modification to the above third embodiment, in place of the electron beam exposure etching mask 513, an i-ray exposure etching mask is also available to form 400 nanometers opening 513.

As a further more modification to the above third embodiment, in place of the electron beam exposure etching mask 513, a KrF laser beam exposure etching mask is also available to form 200 nanometers opening 513.

As a still further modification to the above third embodiment, in place of the reactive ion etching process for forming the first opening pattern 518, a magnetron reactive ion etching process, an electron cyclotron resonance plasma enhanced etching process or an inductive coupled plasma enhanced etching process is also available.

As yet further modification to the above third embodiment, in place of the electron cyclotron resonance plasma enhanced etching process for forming the second opening pattern 520, a magnetron reactive ion etching process, a reactive ion etching process or an inductive coupled plasma enhanced etching process is also available.

As moreover modification to the above third embodiment, in place of the i-ray exposure etching mask 525, a g-ray exposure etching mask or an electron beam exposure etching mask is also available.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a gate recess in an insulating film on a substrate for depositing a gate electrode film being in contact with a part of said substrate and also extending at least within said gate recess, said method comprising the steps of:

forming an etching mask pattern with a first opening pattern on said insulating film;

carrying out a first anisotropic etching process by use of said etching mask pattern at a first selective ratio of said etching mask pattern to said insulating film, thereby to form a first recessed portion having a bottom which lies at a first level higher than an interface level between said insulating film and said substrate; and carrying out a second anisotropic etching process by use of said etching mask pattern again at a second selective ratio of said etching mask pattern to said insulating film, wherein said second selective ratio is higher than said first selective ratio, thereby to form a gate recess which comprises a second recessed portion both having a bottom which lies at said interface level and having first side walls of a first oblique angle and a third recessed portion both having a bottom united with a top of said second recessed portion and having second side walls of a second oblique angle which is smaller than said first oblique angle.

2. The method as claimed in claim 1, wherein said first selective ratio of said first anisotropic etching process is less than 1, whilst said second selective ratio of said second anisotropic etching process is more than 1.

3. The method as claimed in claim 2, wherein said first oblique angle is in the range of 75–90 degrees whilst said second oblique angle is in the range of 45–70 degrees.

4. The method as claimed in claim 1, wherein said level of said bottom of said first recessed portion is not larger than a width of said bottom of said first recessed portion so that said bottom of said second recessed portion reaches said interface level upon said second anisotropic etching process.

5. The method as claimed in claim 1, wherein a depth of said second recessed portion is larger than zero and not larger than a double of a width of said bottom of said first recessed portion.

6. The method as claimed in claim 1, wherein an aspect ratio of said second recessed portion is not larger than 2.

7. The method as claimed in claim 6, wherein an aspect ratio of said second recessed portion is not larger than 1.

8. The method as claimed in claim 1, wherein said first opening pattern of said etching mask pattern has a size of not more than 0.4 micrometers.

9. The method as claimed in claim 1, wherein said etching mask pattern is made of an organic resist material.

10. The method as claimed in claim 1, wherein said etching mask pattern is made of a metal.

11. A method of forming a gate electrode, comprising the steps of:

forming an etching mask pattern with a first opening pattern on an insulating film on a substrate;

carrying out a first arisotropic etching process by use of said etching mask pattern at a first selective ratio of said etching mask pattern to said insulating film, thereby to form a first recessed portion having a bottom which lies at a first level higher than an interface level between said insulating film and said substrate;

carrying out a second anisotropic etching process by use of said etching mask pattern again at a second selective ratio of said etching mask pattern to said insulating film, wherein said second selective ratio is higher than said first selective ratio, thereby to form a gate recess which comprises a second recessed portion both having a bottom which lies at said interface level and having first side walls of a first oblique angle and a third recessed portion both having a bottom united with a top of said second recessed portion and having second side walls of a second oblique angle which is smaller than said first oblique angle; and forming a gate electrode film being in contact with said substrate and also extending at least within said gate recess.

12. The method as claimed in claim 11, wherein said first selective ratio of said first anisotropic etching process is less than 1, whilst said second selective ratio of said second anisotropic etching process is more than 1.

13. The method as claimed in claim 12, wherein said first oblique angle is in the range of 75–90 degrees whilst said second oblique angle is in the range of 45–70 degrees.

14. The method as claimed in claim 11, wherein said level of said bottom of said first recessed portion is not larger than a width of said bottom of said first recessed portion so that said bottom of said second recessed portion reaches said interface level upon said second anisotropic etching process.

15. The method as claimed in claim 11, wherein a depth of said second recessed portion is larger than zero and not larger than a double of a width of said bottom of said first recessed portion.

16. The method as claimed in claim 11, wherein an aspect ratio of said second recessed portion is not larger than 2.

17. The method as claimed in claim 16, wherein an aspect ratio of said second recessed portion is not larger than 1.

18. The method as claimed in claim 11, wherein said first opening pattern of said etching mask pattern has a size of not more than 0.4 micrometers.

19. The method as claimed in claim 11, wherein said etching mask pattern is made of an organic resist material.

20. The method as claimed in claim 11, wherein said etching mask pattern is made of a metal.

21. The method as claimed in claim 11, further comprising a step of removing at least underlying parts of said insulation film under said gate electrode.

* * * * *